(12) United States Patent
Abiko et al.

(10) Patent No.: US 10,651,277 B2
(45) Date of Patent: May 12, 2020

(54) SEMICONDUCTOR DEVICE AND METHOD OF MANUFACTURING THE SAME

(71) Applicant: Renesas Electronics Corporation, Koutou-ku, Tokyo (JP)

(72) Inventors: Yuya Abiko, Ibaraki (JP); Natsuo Yamaguchi, Ibaraki (JP); Satoshi Eguchi, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 16/299,025

(22) Filed: Mar. 11, 2019

(65) Prior Publication Data

US 2019/0207001 A1    Jul. 4, 2019

Related U.S. Application Data

(62) Division of application No. 15/888,944, filed on Feb. 5, 2018, now abandoned.

(30) Foreign Application Priority Data

Mar. 31, 2017    (JP) ................. 2017-069688

(51) Int. Cl.
*H01L 29/66* (2006.01)
*H01L 29/10* (2006.01)
(Continued)

(52) U.S. Cl.
CPC .... *H01L 29/1095* (2013.01); *H01L 21/02529* (2013.01); *H01L 21/26586* (2013.01);
(Continued)

(58) Field of Classification Search
CPC .............. H01L 21/02; H01L 21/02529; H01L 21/26586; H01L 21/308; H01L 29/66;
(Continued)

(56) References Cited

U.S. PATENT DOCUMENTS 8,097,511 B2    1/2012  Shibata et al.
9,041,070 B2    5/2015  Eguchi et al.
(Continued)

FOREIGN PATENT DOCUMENTS

JP    2004-072068 A    3/2004
JP    2008-305927 A    12/2008

OTHER PUBLICATIONS

Extended European Search Report dated Aug. 9, 2018, in European Patent Application No. 18165147.2.

*Primary Examiner* — Chuong A Luu
(74) *Attorney, Agent, or Firm* — SGPatents PLLC

(57) ABSTRACT

In a vertical power MOSFET having a superjunction structure, the withstand voltage of the power MOSFET can be ensured even if the aspect ratios of an n-type column region and a p-type column region are increased so as to vary the impurity concentration of the p-type column region. P-type semiconductor regions PR1 are formed on the sides of an n-type column NC1 adjacent to a p-type column region PC1. In this configuration, the p-type semiconductor region PR1 is formed from the upper end of the n-type column region NC1 to about a half depth of a height from the upper end to the lower end of the side of the n-type column region NC1. This inclines the sides of the overall p-type column region including the p-type semiconductor regions PR1 and the p-type column region PC1.

8 Claims, 25 Drawing Sheets

(51) Int. Cl.
*H01L 29/78* (2006.01)
*H01L 29/739* (2006.01)
*H01L 29/16* (2006.01)
*H01L 21/02* (2006.01)
*H01L 29/06* (2006.01)
*H01L 29/40* (2006.01)
*H01L 21/308* (2006.01)
*H01L 21/265* (2006.01)

(52) U.S. Cl.
CPC ........ *H01L 21/308* (2013.01); *H01L 29/0634* (2013.01); *H01L 29/1608* (2013.01); *H01L 29/404* (2013.01); *H01L 29/66053* (2013.01); *H01L 29/66712* (2013.01); *H01L 29/66734* (2013.01); *H01L 29/7395* (2013.01); *H01L 29/7802* (2013.01); *H01L 29/7813* (2013.01); *H01L 29/66068* (2013.01)

(58) Field of Classification Search
CPC ......... H01L 29/66053; H01L 29/66712; H01L 29/66734; H01L 29/66068; H01L 29/7395; H01L 29/78; H01L 29/7802; H01L 29/7813; H01L 29/1095; H01L 29/0634; H01L 29/1608; H01L 29/404
USPC ...................................................... 438/105
See application file for complete search history.

(56) References Cited

U.S. PATENT DOCUMENTS

| | | |
|---|---|---|
| 2004/0094819 A1 | 5/2004 | Saitoh et al. |
| 2007/0177444 A1 | 8/2007 | Miyajima |
| 2008/0303114 A1 | 12/2008 | Shibata et al. |
| 2009/0302373 A1* | 12/2009 | Tokano ............... H01L 29/0634 257/328 |
| 2009/0321819 A1 | 12/2009 | Kagata et al. |
| 2012/0119225 A1* | 5/2012 | Shiomi ............. H01L 21/02378 257/77 |

* cited by examiner

SEMICONDUCTOR DEVICE AND METHOD OF MANUFACTURING THE SAME

CROSS-REFERENCE TO RELATED APPLICATIONS

The disclosure of Japanese Patent Application No. 2017-069688 filed on Mar. 31, 2017 including the specification, drawings and abstract is incorporated herein by reference in its entirety.

The present invention relates to a semiconductor device and a method of manufacturing the same, and particularly relates to a technique effectively applied to a power semiconductor device.

BACKGROUND

In order to suppress an on resistance while keeping a withstand voltage in a vertical power MOSFET that is a power semiconductor device, the use of a superjunction structure has been examined.

For example, Japanese Unexamined Patent Application Publication No. 2008-305927 discloses a semiconductor device having a superjunction structure where n-conductivity type columns and p-conductivity type columns are alternately arranged. Moreover, in this disclosure, an increase in the aspect of a PN column layer can further reduce the on resistance of a metal oxide semiconductor field-effect transistor (MOSFET) and increase the withstand voltage of the MOSFET. Furthermore, trenches tapered forward are formed on the top surface of an n-conductivity type epitaxial layer, and then a p-conductivity type column having an embedded epitaxial layer is formed in each of the trenches.

SUMMARY

The present inventors have researched and developed vertical power MOSFETs having superjunction structures and diligently examined improvement in the performance of the power MOSFETs. In this process, it is found that if a p-type column region including an embedded epitaxial layer is formed in each groove formed on the top surface of an n-conductivity type epitaxial layer, an increase in the aspect ratio of the groove may vary a concentration in the p-type column region, leading to difficulty in securing a withstand voltage of the vertical power MOSFET.

Other problems and new characteristics will be clarified by a description of the present specification and the accompanying drawings.

The outline of a representative embodiment disclosed in the present application will be simply described as follows:

In a semiconductor device according to the embodiment, a device isolation region embedded in a groove around a fin includes a silicon oxide film and a silicon nitride film that are sequentially stacked from the bottom of the groove, the fin including a FINFET that constitutes a MONOS memory cell.

According to the embodiment disclosed in the present application, the performance of the semiconductor device can be improved.

DETAILED DESCRIPTION

For the convenience of explanation, a plurality of sections or the embodiments will be separately described in the following embodiments. The sections or embodiments are relevant to one another unless otherwise specified. One of the sections or embodiments is, for example, a modification, an application, a detailed explanation, and a supplementary explanation of some or all of the other sections or embodiments. In the following embodiments, the number of elements (including a number, a numeric value, an amount, and a range) is not limited to a specific number unless otherwise specified or clearly limited to the specific number in theory. Thus, the number of elements may be larger or smaller than the specific number.

Obviously, the constituent elements (including element steps) of the following embodiments are not always necessary unless otherwise specified or clearly required in theory. Similarly, the shapes and positional relationships of constituent elements in the following embodiments substantially include the close or similar shapes of the constituent elements unless otherwise specified or clearly excluded in theory. This also holds for the numeric value and the range.

The embodiments will be specifically described below in accordance with the accompanying drawings. In all the explanatory drawings of the following embodiments, members having the same functions are indicated by the same symbols and the repeated explanation thereof is omitted. In the following embodiments, the same or similar parts will not be repeatedly explained in principle unless otherwise required.

(First Embodiment)
<Explanation of the Structure of a Semiconductor Device>

Figure 1:
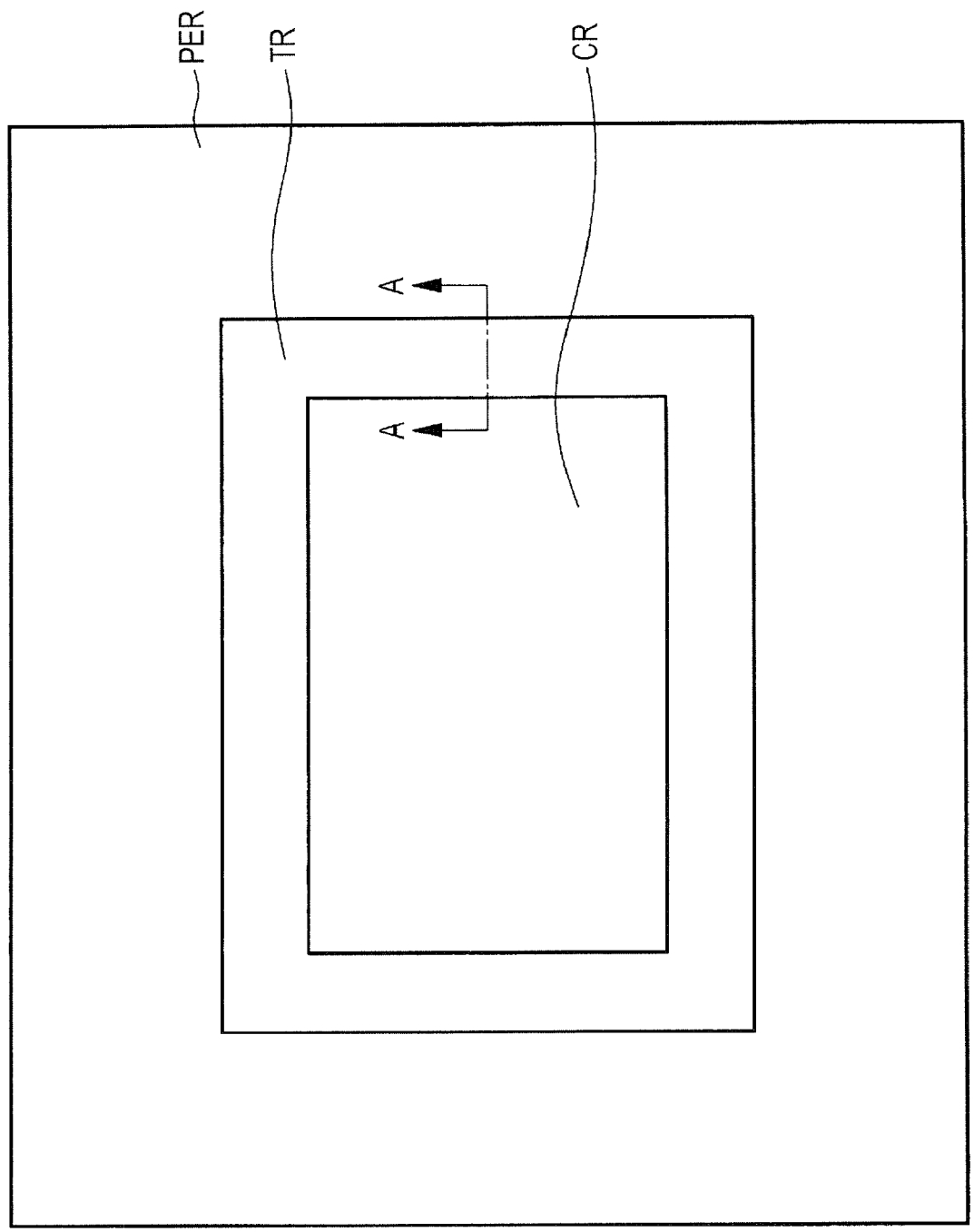
FIG. 1 is a plan view schematically showing the configuration of a semiconductor device according to a first embodiment.
Figure 2:
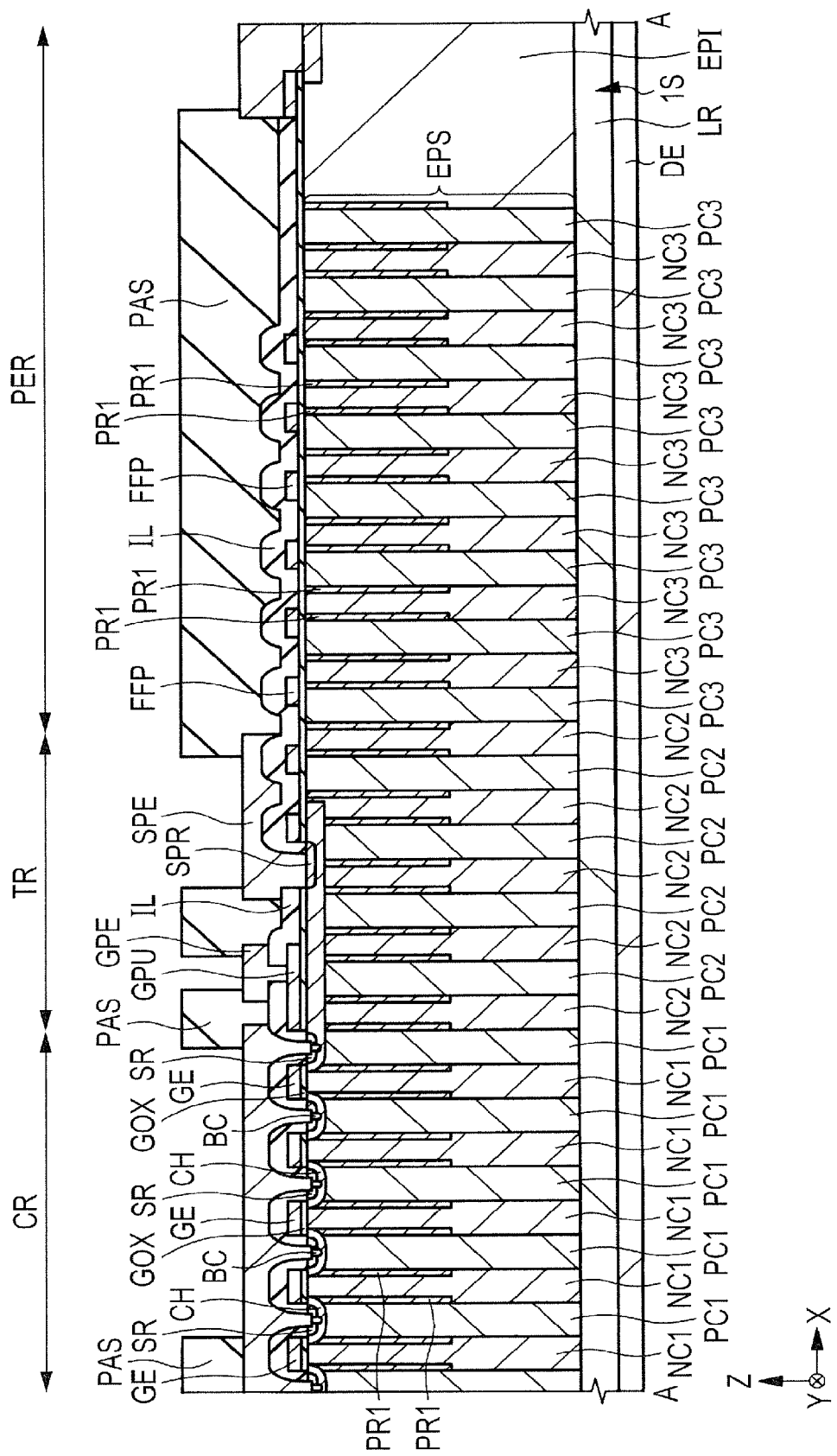
FIG. 2 is a cross-sectional view showing the configuration of the semiconductor device according to the first embodiment.
Figure 3:
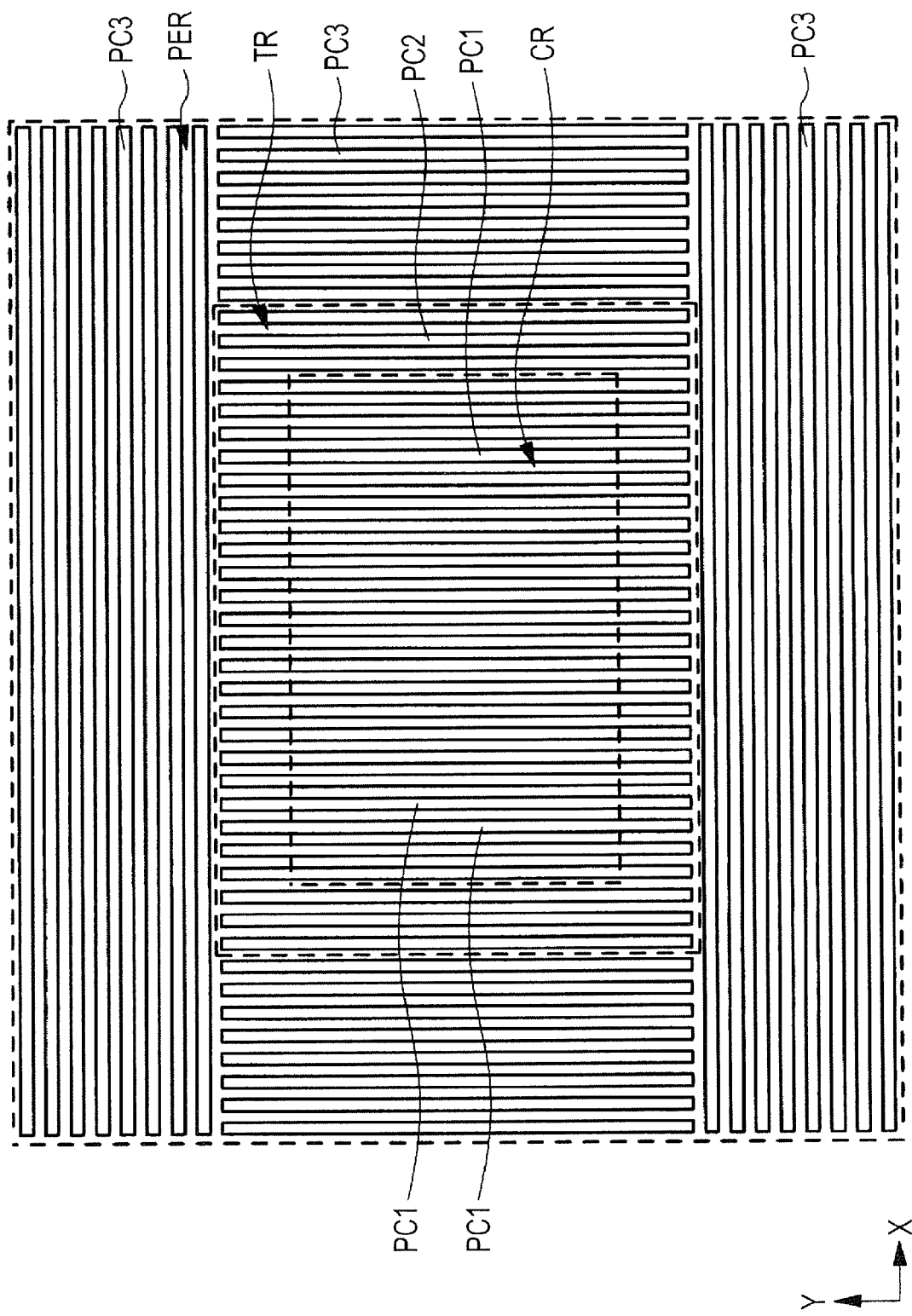
FIG. 3 is a plan view showing the configuration of the p-type column regions of the semiconductor device according to the first embodiment.

Referring to FIGS. 1 to 3, the structure of the semiconductor device according to a first embodiment will be described below. FIG. 1 is a plan view schematically showing the configuration of the semiconductor device according to the present embodiment. FIG. 2 is a cross-sectional view showing the configuration of the semiconductor device according to the present embodiment. The cross section of FIG. 2 corresponds to, for example, a part A-A in FIG. 1. The semiconductor device (semiconductor element) of the present embodiment is a vertical power metal oxide semiconductor field effect transistor, that is, a MOS field-effect transistor (MOSFET). The MOSFET may be called a metal insulator semiconductor field effect transistor (MOSFET). FIG. 3 is a plan view showing the configuration of the p-type column regions of the semiconductor device according to the present embodiment.

As shown in FIG. 1, the semiconductor device (semiconductor chip) of the present embodiment is rectangular in plan view when viewed from the top surface. The semiconductor device of the present embodiment has a cell region CR, an intermediate region (also called a termination part or a terminal end part) TR, and a peripheral region PER. The cell region CR is disposed at the center of the substantially rectangular semiconductor device, the intermediate region TR is disposed around the outside of the cell region CR, and the peripheral region PER is disposed around the intermediate region TR. Referring to FIG. 2, the configuration of the semiconductor device in each of the regions will be discussed below.

(1) The Structure of the Cell Region CR

As shown in FIG. 2, the cell region CR has power MOSFETs. The power MOSFETs are formed on the major surface of an epitaxial layer (semiconductor layer) EPS on a semiconductor substrate 1S. In FIG. 2, the semiconductor substrate 1S corresponds to an n-type semiconductor region LR. In other words, the n-type semiconductor region LR is formed over the interior of the semiconductor substrate 1S.

The epitaxial layer EPS includes a plurality of p-type column regions (also called p-type pillars or pillars) PC1 and a plurality of n-type column regions (also called n-type pillars or pillars) NC1. The p-type column regions PC1 and the n-type column regions NC1 are alternately disposed in the X direction. The structure including the periodically arranged p-type column regions PC1 and n-type column regions NC1 is called a superjunction structure. As shown in FIG. 3, the p-type column regions PC1 are shaped like lines (rectangles having long sides along the Y direction) in plan view when viewed from the top surfaces.

For example, this configuration is designed such that the width (a dimension in the X direction) and the depth (a dimension in the Y direction) of the p-type column region PC1 are equal to the width (a dimension in the X direction) and the depth (a dimension in the Y direction) of the n-type column region NC1. The X direction and the Y direction of the present application are extended along the top surface of the semiconductor substrate 1S and the top surface of the epitaxial layer EPS so as to intersect each other in plan view. Moreover, the Z direction is orthogonal to the X direction and the Y direction (a lateral direction or a horizontal direction). In other words, the Z direction is a direction perpendicular (a lengthwise direction, a vertical direction, a height direction, or a depth direction) to the top surface of the semiconductor substrate 1S and the top surface of the epitaxial layer EPS.

For example, the n-type column region NC1 is shaped like a column and includes a semiconductor region (epitaxial layer) doped with an n-type impurity, e.g., phosphorus (P) or arsenic (As). The n-type impurity concentration of the n-type column region NC1 is, for example, $2.5 \times 10^{15}/cm^3$-$3.5 \times 10^{15}/cm^3$. Moreover, the n-type column region NC1 has a specific resistance of, for example, 1.4 to 2.0 Ω·cm. The n-type column region NC1 and the semiconductor substrate 1S constitute the drain region of the power MOSFET. The n-type column region NC1 is interposed between the two p-type column regions PC1. The interval between the n-type column regions NC1 is equal to the width (a dimension in the X direction) of the p-type column region PC1.

For example, the p-type column region PC1 is shaped like a column and includes a semiconductor region doped with a p-type impurity, e.g., boron (B). The p-type column region PC1 is interposed between the two n-type column regions NC1. The interval between the p-type column regions PC1 is equal to the width (a dimension in the X direction) of the n-type column region NC1. The p-type impurity concentration of the p-type column region PC1 is, for example, $3.0 \times 10^{15}/cm^3$-$6.0 \times 10^{15}/cm^3$. Moreover, the p-type column region PC1 has a specific resistance of, for example, 2.3 to 4.5 Ω·cm.

The power MOSFETs are formed on the major surface of the structure (epitaxial layer EPS) including the periodically arranged p-type column regions PC1 and n-type column regions NC1.

For example, the top surface of the p-type column region PC1 is 5 μm in width in the X direction, the top surface of the n-type column region NC1 is 6 μm in width in the X direction, and the p-type column region PC1, the n-type column region NC1, and the epitaxial layer EPS are 60 μm in thickness (depth) in a vertical direction (Z direction). In other words, the p-type column region PC1 has an aspect ratio of 12. These dimensions are equal to those of p-type column regions PC2 and PC3 and n-type column regions NC2 and NC3.

The power MOSFET has a gate electrode GE disposed on the n-type column region NC1 with a gate insulating film GOX interposed between the n-type column region NC1 and the gate electrode GE. The gate insulating film GOX may be, for example, a silicon oxide film. Instead of the silicon oxide film, for example, a high dielectric film having a higher dielectric constant than the silicon oxide film may be used as the gate insulating film GOX. The gate electrode GE may be, for example, a polycrystalline silicon film.

Channel regions CH are disposed on the p-type column regions PC1 on both sides of the gate electrode GE. A source region SR is disposed so as to be contained in the channel region CH. The channel region CH includes a semiconductor region doped with a p-type impurity, e.g., boron (B) and the source region SR includes a semiconductor region doped with an n-type impurity, e.g., phosphorus (P) or arsenic (As). As described above, the n-type column region NC1 and the semiconductor substrate 1S constitute the drain region of the power MOSFET.

If a potential is applied to the gate electrode GE of the power MOSFET, a carrier (electron) flows into the drain region (the n-type column region NC1 or the semiconductor substrate 1S (LR)) from the source region SR through an inversion layer formed in the channel region CH. In other words, a current flows into the source region SR from the drain region (the n-type column region NC1 or the semiconductor substrate 1S (LR)) through the inversion layer formed in the channel region CH.

The gate electrode GE extending in the Y direction, the n-type column region NC1 disposed below the gate electrode GE, and the source regions SR on both sides of the n-type column region NC1 constitute a unit cell. The unit cells are disposed in a repeated pattern. The unit cells coupled in parallel form the power MOSFET.

At the center of the source region SR, a body contact region BC is formed so as to reach the channel region CH from the top surface of the epitaxial layer EPS. The body contact region BC includes a semiconductor region doped with a p-type impurity, e.g., boron (B). The body contact region BC has a higher impurity concentration than the channel region CH.

The top surface and both sides of the gate electrode GE are covered with an interlayer insulating film IL. The interlayer insulating film IL may be, for example, a silicon oxide film. The interlayer insulating film IL is removed from the body contact region BC and the source regions SR on both sides of the body contact region BC so as to form a contact hole. A source electrode SE is disposed on the contact hole and the interlayer insulating film IL. The source electrode SE may be, for example, a laminated film including a barrier conductor film composed of a titanium tungsten film and a main conductor film composed of an aluminum film on the barrier conductor film.

With this configuration, the source electrode SE is electrically coupled to the source region SR and is also electrically coupled to the channel region CH via the body contact region BC. The body contact region BC has the function of ensuring an ohmic contact with the source electrode SE. The presence of the body contact region BC electrically couples the source region SR and the channel region CH at the same potential.

Thus, the turn-on operation of a parasitic npn bipolar transistor can be suppressed with the source region SR serving as an emitter region, the channel region CH serving as a base region, and the n-type column region NC1 serving as a collector region. In other words, the electrical coupling between the source region SR and the channel region CH at the same potential means no potential difference between the emitter region and the base region of the parasitic npn bipolar transistor. This can suppress the turn-on operation of the parasitic npn bipolar transistor.

A passivation film PAS is disposed on the source electrode SE so as to partially cover the source electrode SE. The passivation film PAS may be, for example, a silicon oxide film. The source electrode SE is partially exposed from the passivation film PAS. Moreover, a drain electrode DE including a metal film is disposed on the back side (opposite from the major surface where the epitaxial layer EPS is foimed) of the semiconductor substrate 1S.

(2) The Structure of the Intermediate Region TR

As shown in FIG. 2, the intermediate region TR has a gate lead part GPU, a gate lead electrode GPE, a source lead region SPR, and a source lead electrode SPE.

The gate lead part GPU and the gate lead electrode GPE are disposed on the epitaxial layer EPS on the semiconductor substrate 1S. The source lead region SPR is disposed on the epitaxial layer EPS.

Also in the intermediate region TR, the p-type column regions PC2 and the n-type column regions NC2 are periodically disposed. In other words, as shown in FIG. 3, in a rectangular region where the linear p-type column regions PC2 and the linear n-type column regions NC2 (not shown) are alternately disposed, a region around the central cell region CR serves as the intermediate region TR. Thus, the linear p-type column regions PC2 and the linear n-type column regions NC2 are alternately disposed along the Y-direction sides (right and left sides in FIG. 3) of the intermediate region TR. Furthermore, the ends of the linear p-type column regions PC2 and the linear n-type column regions NC2 that are extended from the cell region CR are alternately disposed along the X-direction sides (upper and lower sides in FIG. 3) of the intermediate region TR.

The structure (epitaxial layer EPS) including the periodically arranged p-type column regions PC2 and n-type column regions NC2 in the intermediate region TR is identical to the structure (epitaxial layer EPS) including the periodically arranged p-type column regions PC1 and n-type column regions NC1 in the cell region CR.

The gate lead part GPU is disposed on the epitaxial layer EPS with the gate insulating film GOX interposed between the gate lead part GPU and the epitaxial layer EPS. The channel region CH is also disposed under the gate lead part GPU. Moreover, the interlayer insulating film IL is disposed so as to cover the top surface and both sides of the gate lead part GPU. An opening for partially exposing the top surface of the gate lead part GPU is formed on a part of the interlayer insulating film IL. The gate lead part GPU may be, for example, a polycrystalline silicon film like the gate electrode GE.

The gate lead electrode GPE is disposed on the interlayer insulating film IL including the opening. Like the source electrode SE, the gate lead electrode GPE may be, for example, a laminated film including a barrier conductor film composed of a titanium tungsten film and a main conductor film composed of an aluminum film on the barrier conductor film.

In this configuration, the gate lead part GPU is electrically coupled to the multiple gate electrodes GE. A gate voltage applied to the gate lead electrode GPE is applied to each of the gate electrodes GE through the gate lead part GPU.

The channel regions CH extending from the cell region CR are formed on the epitaxial layer EPS. The source lead region SPR is disposed so as to be contained in the channel region CH. Like the source region SR, the source lead region SPR includes a semiconductor region doped with an n-type impurity, e.g., phosphorus (P) or arsenic (As).

The interlayer insulating film IL is disposed on the top surface of the epitaxial layer EPS so as to cover the channel region CH. An opening is formed on the interlayer insulating film IL so as to expose the source lead region SPR.

The source lead electrode SPE is disposed on the interlayer insulating film IL including the opening. Like the source electrode SE, the source lead electrode SPE may be, for example, a laminated film including a barrier conductor film composed of a titanium tungsten film and a main conductor film composed of an aluminum film on the barrier conductor film.

Also in the intermediate region TR, the passivation film PAS including a silicon oxide film is disposed so as to partially cover the gate lead electrode GPE and the source lead electrode SPE, and the region of the gate lead electrode GPE and the region of the source lead electrode SPE are partially exposed from the passivation film PAS.

(3) The Structure of the Peripheral Region PER

As shown in FIG. 2, field plate electrodes (also called electrodes or dummy electrodes) FFP are formed in the peripheral region PER.

The field plate electrodes FFP are disposed on the epitaxial layer EPS on the semiconductor substrate 1S.

Also in the peripheral region PER, the p-type column regions PC3 and the n-type column regions NC3 are periodically disposed. As shown in FIG. 3, the peripheral region PER surrounds the rectangular region (cell region CR) where the linear p-type column regions PC1 and the linear n-type column regions NC1 are alternately disposed and the rectangular region (intermediate region TR) where the linear p-type column regions PC2 and the linear n-type column regions NC2 are alternately disposed. Moreover, the linear p-type column regions PC3 and the linear n-type column regions NC3 that extend in the Y direction are alternately disposed along the Y-direction sides (right and left sides in FIG. 3) of the peripheral region PER. The linear p-type column regions PC3 and the linear n-type column regions NC3 that extend in the X-direction are alternately disposed along the X-direction sides (upper and lower sides in FIG. 3) of the intermediate region TR.

The p-type column regions PC3 and the n-type column regions NC3 (epitaxial layer EPS) in the peripheral region PER are designed with the same width as the p-type column regions PC1, PC2 and the n-type column regions NC1, NC2 in the cell region CR and the intermediate region TR.

The field plate electrodes FFP are formed on the p-type column regions PC3 and the n-type column regions NC3 (epitaxial layer EPS) of the peripheral region PER (FIG. 2). The field plate electrode FFP may be, for example, a polycrystalline silicon film like the gate electrode GE. The field plate electrodes FFP are covered with the interlayer insulating film IL. The passivation film PAS including a silicon oxide film is disposed on the interlayer insulating film IL. The provision of the field plate electrodes FFP can reduce an electric field concentration and increase a withstand voltage.

The field plate electrodes FFP are disposed on, for example, the boundaries between the p-type column regions PC3 and the n-type column regions NC3 and are linearly disposed like the p-type column regions PC3 and the n-type column regions NC3.

The power MOSFETs are disposed on the major surface of the structure (superjunction structure) where the p-type column regions (PC1) and the n-type column regions (NC1) are periodically disposed. This can reduce an on resistance while ensuring a high withstand voltage.

For example, if the power MOSFETs are disposed on the major surface of an n-type epitaxial layer without using a superjunction structure, a withstand voltage needs to be ensured by reducing the impurity concentration of the epitaxial layer and extending a depletion layer formed on the epitaxial layer.

Thus, in order to obtain a high withstand voltage, the epitaxial layer having a low impurity concentration needs to be increased in thickness. The larger the thickness of the epitaxial layer having a low impurity concentration, the higher the on resistance of the power MOSFET. In other words, in the power MOSFET, a trade-off is made between an increase in withstand voltage and a decrease in on resistance.

In the case where the power MOSFETs are disposed on the major surface of the structure (superjunction structure) where the p-type column regions (PC1) and the n-type column regions (NC1) are periodically disposed, the depletion layer horizontally extends from a boundary region between the p-type column region (PC1) and the n-type column region (NC1), that is, a pn junction extending in a vertical direction (Z direction). Thus, in the power MOSFETs of the superjunction structure, even if the impurity concentrations of the n-type column regions NC1 serving as current paths are increased, a reduction in on resistance horizontally extends the depletion layer from the pn junction extending in the vertical direction (Z direction), thereby ensuring a withstand voltage.

In this way, the structure including the periodically disposed p-type column regions (PC1) and n-type column regions (NC1) can reduce an on resistance while ensuring a high withstand voltage.

Also in the intermediate region TR and the peripheral region PER as well as the cell region CR, the p-type column regions (PC2, PC3) and the n-type column regions (NC2, NC3) are periodically disposed so as to extend the depletion layer around the cell region CR, thereby improving a withstand voltage.

(4) P-type Semiconductor Regions PR1 Adjacent to the p-type Column Regions (PC1 to PC3)

The semiconductor device of the present embodiment features the p-type semiconductor regions PR1 formed on both sides of the n-type pillars (n-type column regions NC1 to NC3). The p-type semiconductor regions PR1 are formed in n-type pillars where the n-type column regions NC1 to NC3 are formed. The semiconductor regions PR1 have p-type conductivity. In other words, the p-type semiconductor regions PR1 do not constitute the n-type column regions NC1 to NC3. The p-type semiconductor regions PR1 constitute the p-type column region along with the p-type column region PC1, PC2, or PC3 adjacent to the p-type semiconductor regions PR1. In other words, the p-type semiconductor regions PR1 constitute a part of the p-type column region. The p-type impurity concentration of the p-type semiconductor region PR1 is, for example, about $8 \times 10^{15}/cm^3$. In other words, the p-type semiconductor region PR1 has the same impurity concentration as the p-type column regions PC1 to PC3.

In the cell region CR, the n-type column region NC1 is formed between the p-type semiconductor regions PR1 formed on both sides of the n-type pillar. Also in the intermediate region TR, the n-type column region NC2 is formed between the p-type semiconductor regions PR1 formed on both sides of the n-type pillar. Also in the peripheral region PER, the n-type column region NC3 is formed between the p-type semiconductor regions PR1 formed on both sides of the n-type pillar. Specifically, in the cell region CR, for example, the n-type column region NC1, the p-type semiconductor region PR1, the p-type column region PC1, the p-type semiconductor region PR1, and the n-type column region NC1 are sequentially arranged in the X direction.

The p-type semiconductor regions PR1 are formed from the top surface of the epitaxial layer EPS (the top surfaces of the n-type column regions NC1) to a certain depth in the thickness direction of the epitaxial layer EPS. The p-type semiconductor regions PR1 are not formed near the bottoms of the p-type column regions PC1 to PC3. In other words, the p-type semiconductor region PR1 on each side of the n-type pillar is formed from the top surface of the n-type pillar to a certain depth in the thickness direction of the n-type pillar. Thus, under the p-type semiconductor regions PR1, the p-type column regions PC1 are in direct contact with the n-type column regions NC1 having n-type conductivity.

In other words, in a region adjacent to the p-type column region PC1, PC2, or PC3, the p-type semiconductor region PR1 is formed from the same height as the top surface of the p-type column region PC1, PC2, or PC3 to a certain depth of the p-type column region PC1, PC2, or PC3 in the Z direction. Specifically, the p-type semiconductor region PR1 is formed from the top surface of the epitaxial layer EPS to about a half depth of the p-type column region PC1, PC2, or PC3. A depth from the upper end to the lower end of the p-type semiconductor region PR1 in the Z direction is, for example, 30 μm.

The width of the p-type semiconductor region PR1 in the X direction is substantially uniform from the upper end to the lower end of the p-type semiconductor region PR1. In other words, the p-type semiconductor regions PR1 extend along the sides of the p-type column region PC1, PC2, or PC3. The p-type semiconductor regions PR1 extend in the Y direction along the p-type column regions PC1 and PC2 in FIG. 3. Along the p-type column regions PC3 extending in the Y direction in FIG. 3, the p-type semiconductor regions PR1 extend in the Y direction. The p-type semiconductor regions PR1 are omitted in FIG. 3.

<Explanation of a Method of Manufacturing the Semiconductor Device>

Referring to FIGS. 4 to 14, the method of manufacturing the semiconductor device according to the present embodiment will be described below. The configuration of the semiconductor device according to the present embodiment will be further clarified. FIGS. 4 to 14 are cross-sectional views showing the manufacturing process of the semiconductor device according to the present embodiment. The semiconductor device of the present embodiment is manufactured by using a method called "trench filling".

Figure 4:
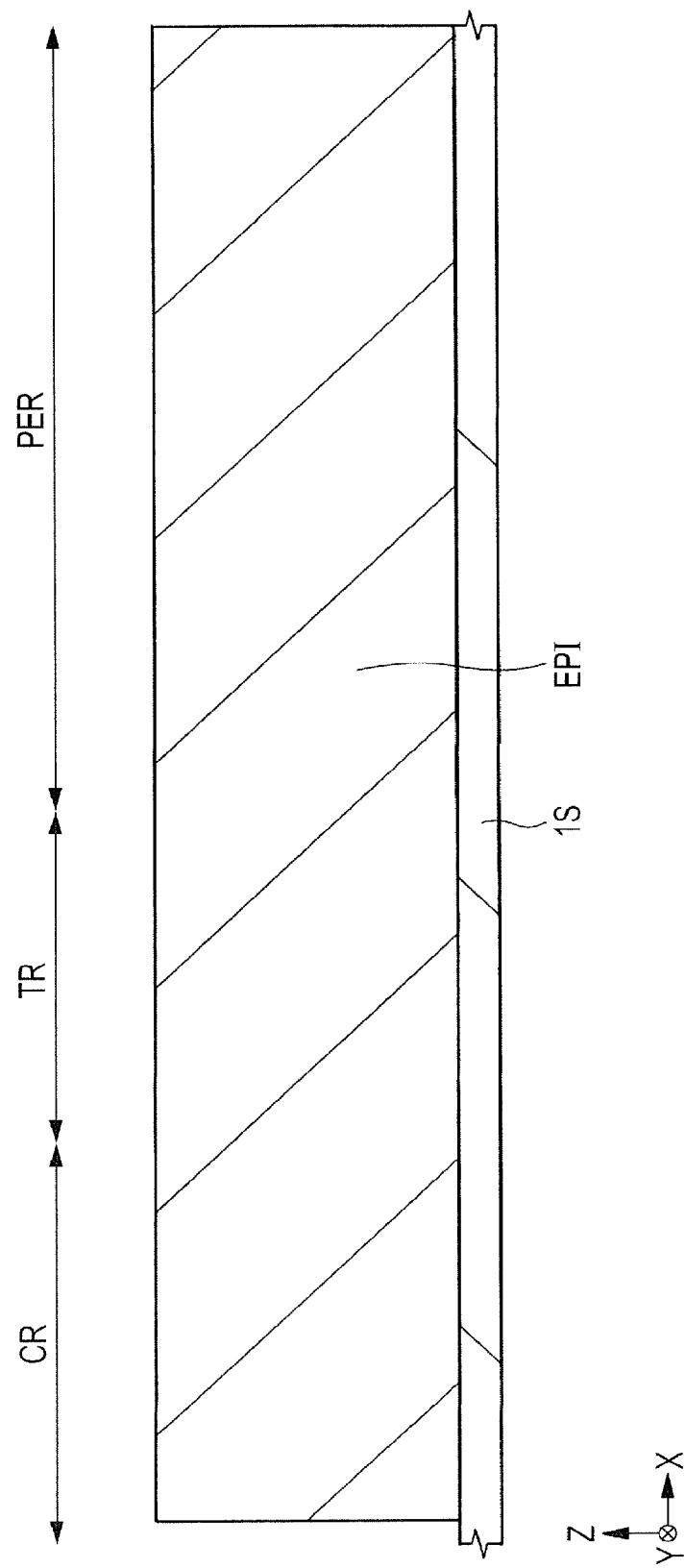
FIG. 4 is a cross-sectional view showing the manufacturing process of the semiconductor device according to the first embodiment.

First, as shown in FIG. 4, the semiconductor substrate 1S is prepared with an epitaxial layer EPI including an n-type semiconductor layer on the major surface (the front surface, the top surface) of the semiconductor substrate 1S. For example, the semiconductor substrate 1S is formed by doping single-crystal silicon with an n-type impurity, e.g., phosphorus (P) or arsenic (As). The epitaxial layer EPI has an n-type impurity concentration of, for example, $2.5 \times 10^{15}/cm^3$-$3.5 \times 10^{15}/cm^3$ and has a thickness of, for example, about 60 μm. Moreover, the epitaxial layer EPI has a specific resistance of, for example, 1.4 to 2.0 Ω·cm.

Figure 5:
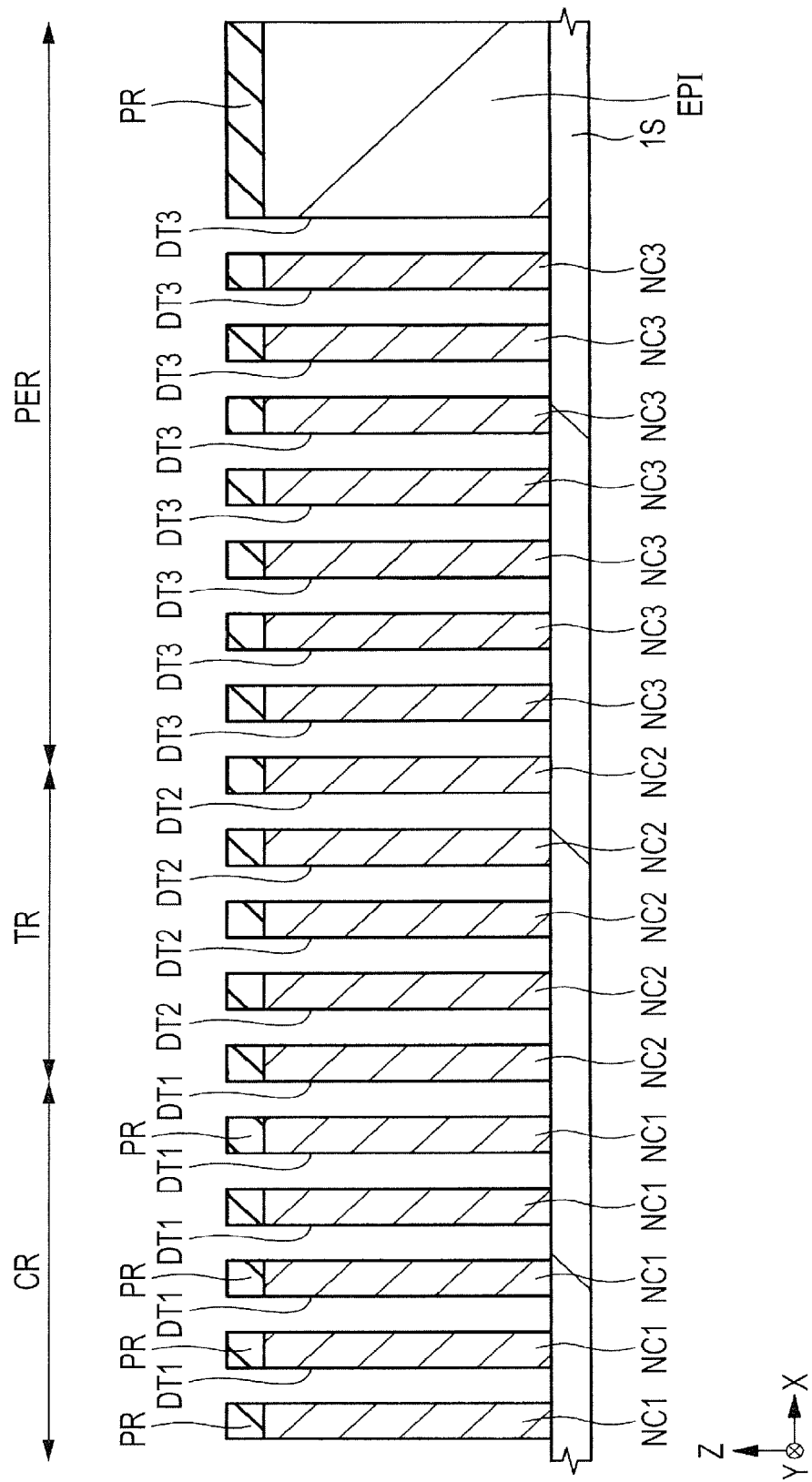
FIG. 5 is a cross-sectional view for explaining the manufacturing process of the semiconductor device subsequent to FIG. 4.

Subsequently, as shown in FIG. 5, a photoresist film PR is formed on the epitaxial layer EPI and then is exposed and developed. This forms the photoresist film PR in the formation regions of the n-type column regions (NC1, NC3) on the epitaxial layer EPI. In other words, the epitaxial layer EPI is exposed in the formation regions of the p-type column regions (PC1, PC3). The cell region CR (including the intermediate region TR) and the peripheral region PER may be exposed (reticle transfer) simultaneously or separately.

Subsequently, the epitaxial layer EPI is etched with the photoresist film PR serving as a mask (etching prevention mask). This removes the epitaxial layer EPI in the formation regions of the p-type column regions (PC1, PC2, and PC3) so as to form grooves (trenches) DT1, DT2, and DT3. In this way, with a photoresist film or a hard mask film that is machined into a desired shape by exposure and development, a lower film is machined into the desired shape. This technique is called patterning.

In this configuration, the grooves formed on the epitaxial layer EPI in the cell region CR are denoted as DT1, the grooves formed on the epitaxial layer EPI in the intermediate region TR are denoted as DT2, and the grooves formed on the epitaxial layer EPI in the peripheral region PER are denoted as DT3. The grooves DT1 and the grooves DT2 are linearly extended in the Y direction and the grooves DT3 are linearly extended in the Y direction or the X direction.

For example, the grooves DT1, the grooves DT2, and the grooves DT3 are about 5 μm in width (a dimension in the X direction or the Y direction) and are about 60 μm in depth (a dimension in the Z direction). The epitaxial layer EPI remaining between the grooves DT1, the grooves DT2, and the grooves DT3 form the linear n-type column regions NC1, NC2, and NC3. For example, the n-type column regions (NC1, NC2, and NC3) are about 6 μm in width (a dimension in the X direction). The n-type column regions (NC1, NC2, and NC3) are about 60 μm in depth (a dimension in the Z direction). In this configuration, the grooves DT1 to DT3 reach the top surface of the semiconductor substrate 1S. The grooves DT1 to DT3 may not reach the top surface of the semiconductor substrate 1S.

In this configuration, the deep grooves DT1 to DT3 are formed by alternately repeating the etching step and the step of deposition on the sides of the trenches that are formed on the top surface of the epitaxial layer EPI by the etching step. The etching method can form the grooves DT1, DT2, and DT3 with the both sides substantially at right angles with respect to the top surface of the semiconductor substrate 1S. Specifically, an angle θ1 (FIG. 13) formed by one side of the groove DT1 and the top surface of the semiconductor substrate 1S is, for example, 89.3°. In other words, the sides of the grooves DT1 to DT3 are substantially vertical but are tapered (tapered forward).

Figure 6:
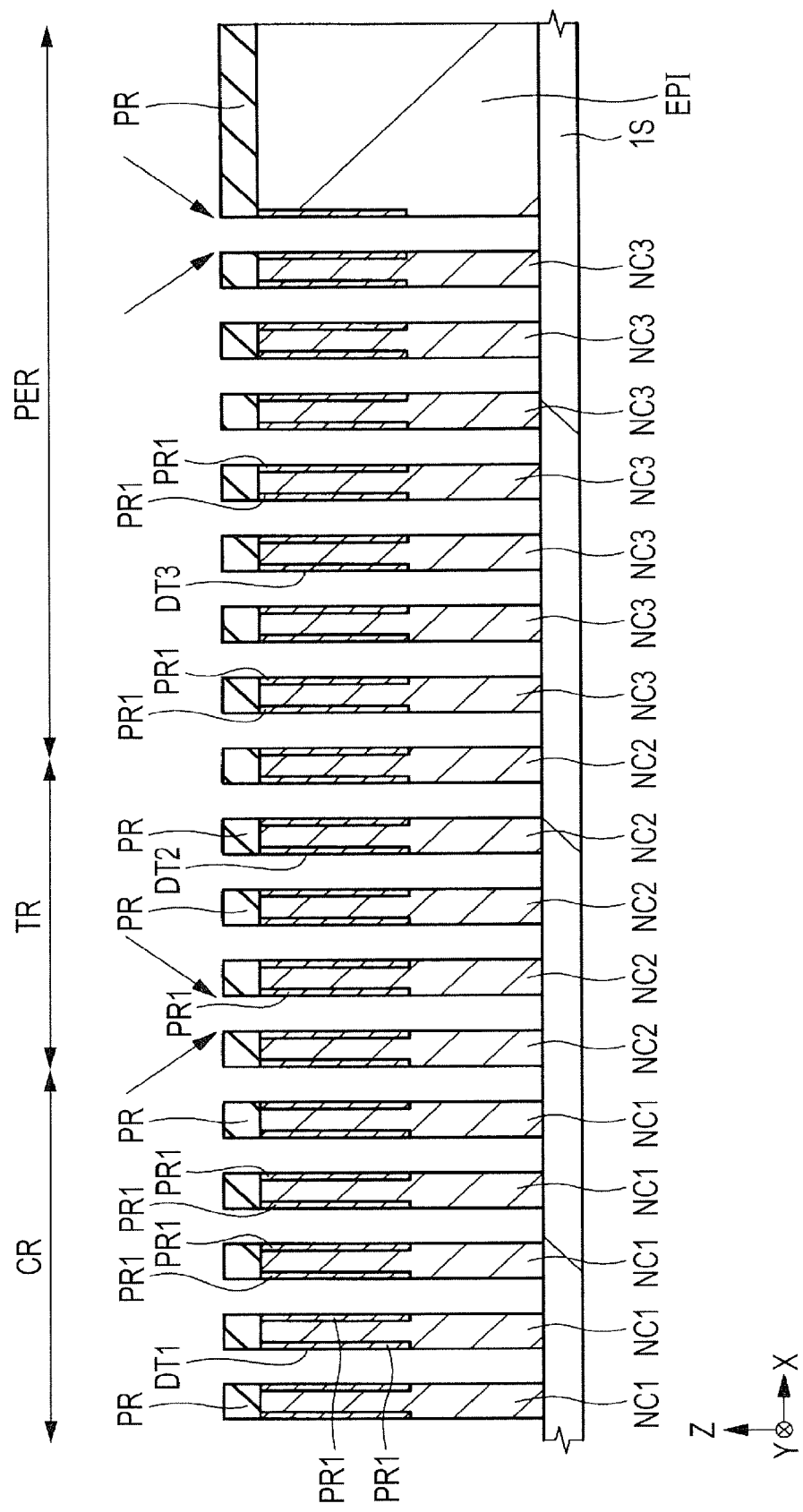
FIG. 6 is a cross-sectional view for explaining the manufacturing process of the semiconductor device subsequent to FIG. 5.

After that, as shown in FIG. 6, the p-type semiconductor regions PR1 are formed on the sides of the grooves DT1 to DT3 by performing ion implantation on the sides of the grooves DT1 to DT3 diagonally with respect to the top surface (the top surface of the epitaxial layer EPI) of the semiconductor substrate 1S with the photoresist film PR serving as a mask. In other words, a p-type impurity (e.g., boron (B)) is diagonally implanted into the epitaxial layer EPI. Thus, for example, the impurity is implanted into the upper half parts of the sides of the grooves DT1 to DT3 but is not implanted into the lower half parts of the sides of the grooves DT1 to DT3. Moreover, the impurity is not implanted into the bottoms of the grooves DT1 to DT3.

Hence, the p-type semiconductor regions PR1 are formed from the upper ends of the sides of the grooves DT1 to DT3 to a certain depth of the sides of the grooves DT1 to DT3. Specifically, the p-type semiconductor regions PR1 are formed from the top surface of the epitaxial layer EPI to a half depth of the grooves DT1 to DT3. A depth from the upper end to the lower end of the p-type semiconductor region PR1 is, for example, 30 μm in the Z direction. In other words, in this configuration, the p-type semiconductor region PR1 is formed from the height of the upper end of the n-type column region NC1 to a half height of the n-type column region NC1.

The implantation conditions of the ion implantation step include, for example, implantation energy of 40 keV and a dose of $1.0 \times 1011/cm^2$ to $3.0 \times 10^{11}/cm^2$. Moreover, implantation is performed at an angle of 4 to 5° formed from the vertical direction (Z direction) in the X direction (the transverse direction of the n-type pillar). In this case, after the diagonal implantation at 4 to 5°, implantation is performed at 4 to 5° also on the opposite side with respect to the vertical direction, thereby forming the p-type semiconductor regions PR1 disposed on the upper parts of both sides of the n-type pillar in the transverse direction of the n-type pillar. In short, after the diagonal implantation in one direction, implantation is diagonally performed from a position rotated by 180° in plan view. In other words, diagonal ion implantation is also performed in a direction that is line symmetric with respect to the Y-axis.

In this configuration, after the p-type semiconductor regions PR1 are formed, the step of removing the photoresist film PR, the cleaning step, and the step of epitaxial growth are performed as will be discussed later without heat treatment for activating the p-type semiconductor regions PR1.

Figure 7:
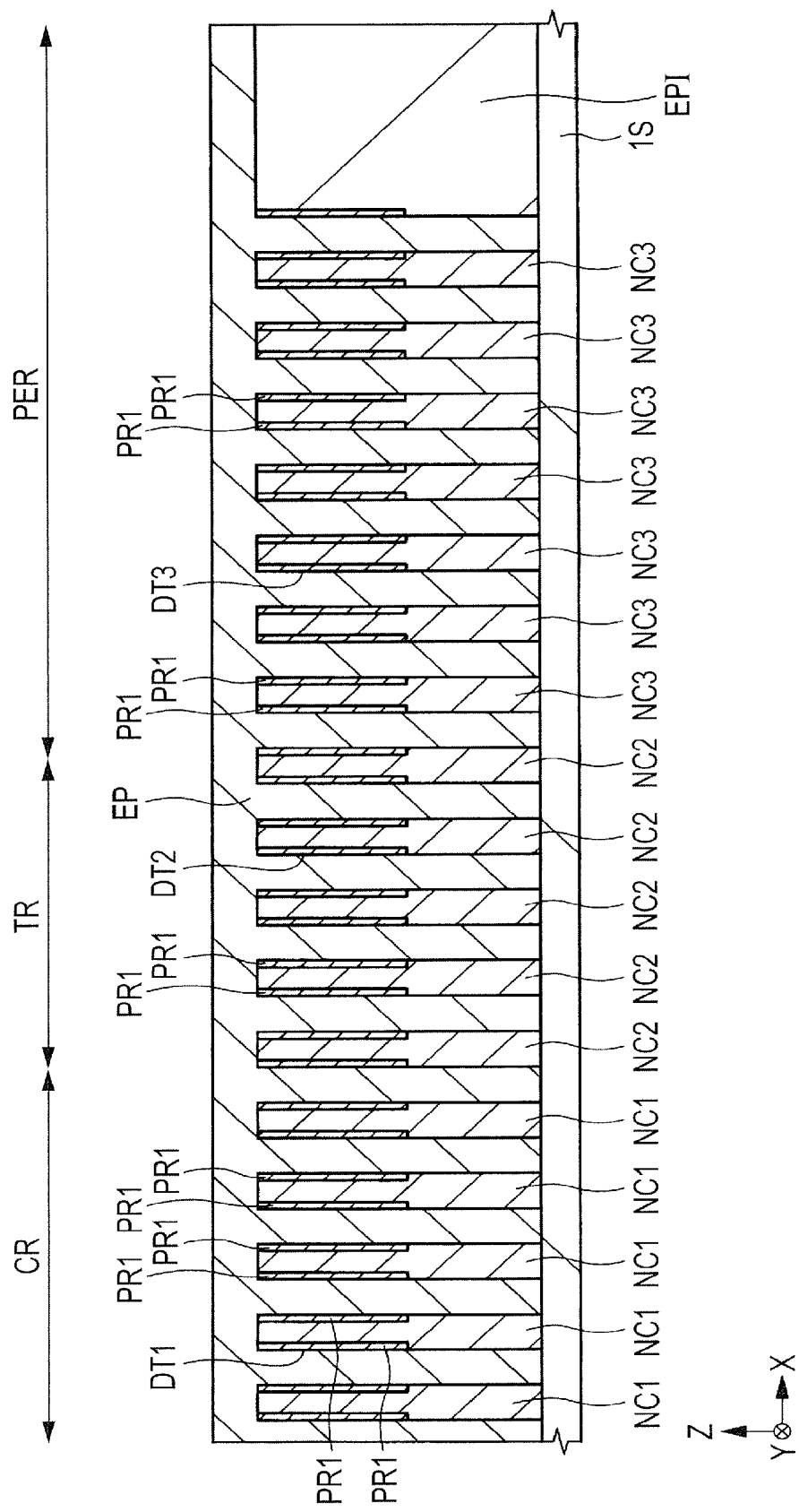
FIG. 7 is a cross-sectional view for explaining the manufacturing process of the semiconductor device subsequent to FIG. 6.

Subsequently, as shown in FIG. 7, the photoresist film PR is removed by ashing and so on, and then the cleaning step is performed.

After that, the p-type epitaxial layer EP is formed in the grooves DT1, DT2, and DT3 and on the epitaxial layer EPI by filling epitaxial growth. In other words, the epitaxial layer is grown while being doped with a p-type impurity. At this point, the epitaxial layer EP is grown from the bottoms and sides of the grooves DT1, DT2, and DT3 so as to fill the grooves DT1, DT2, and DT3. The epitaxial layer EP is also grown on the epitaxial layer EPI between the grooves and is grown over the grooves DT1, DT2, and DT3 filled with the epitaxial layer EP. The p-type impurity concentration of the epitaxial layer EP is, for example, $3.0 \times 10^{15}/cm^3$-$6.0 \times 10^{15}/cm^3$. The epitaxial layer EP has a specific resistance of, for example, 2.3 to 4.5 Ω·cm.

In the step of epitaxial growth, the semiconductor substrate 1S is heated to, for example, about 1050 to 1100° C. along with the epitaxial layer EPI. In short, the semiconductor substrate 1S is heated to at least 1000° C. along with the epitaxial layer EPI. The heat activates the p-type impurity in the p-type semiconductor regions PR1. The p-type semiconductor regions PR1 are also activated by heat treatment performed to activate the source regions constituting the power MOSFETs, which will be formed later. Thus, after the p-type semiconductor regions PR1 are formed by the step of diagonal ion implantation described with reference to FIG. 6, heat treatment for activating the p-type semiconductor regions PR1 does not need to be performed in the step of forming the epitaxial layer EP. In other words, the step of heat treatment can be omitted. Specifically, in this case, the step of forming the p-type semiconductor regions PR1 and the step of forming the epitaxial layer EP are consecutively performed.

Figure 8:
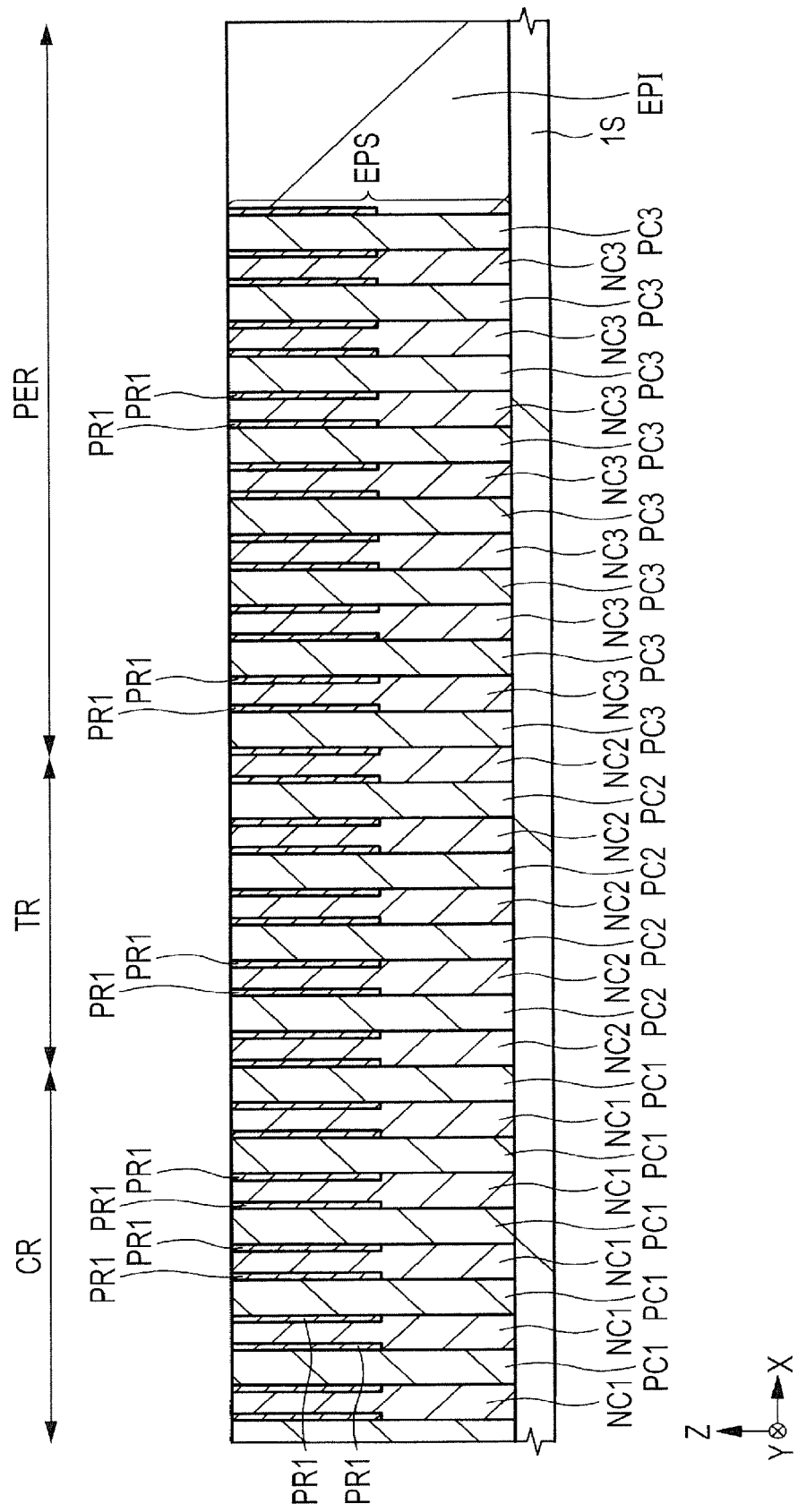
FIG. 8 is a cross-sectional view for explaining the manufacturing process of the semiconductor device subsequent to FIG. 7.

Subsequently, as shown in FIG. 8, the epitaxial layer EP on the grooves DT1, DT2, and DT3 is removed by chemical mechanical polishing (CMP) and so on, forming the grooves DT1, DT2, and DT3 filled with the epitaxial layer EP. This step forms the linear p-type column regions PC1, PC2, and PC3. In other words, this step forms the epitaxial layer EPS including the p-type column regions PC1, PC2, and PC3 and the n-type column regions NC1, NC2, and NC3.

In the cell region CR and the intermediate region TR, these steps form a structure where the linear p-type column regions PC1 extending in the Y direction and the linear n-type column regions NC1 extending in the Y direction are periodically and alternately disposed in the X direction. In the peripheral region PER, these steps form a structure where the linear p-type column regions PC1 extending in the Y direction and the linear n-type column regions NC1 extending in the Y direction are periodically and alternately disposed in the X direction, and a structure where the linear p-type column regions PC3 extending in the X direction and the linear n-type column regions NC3 extending in the X direction are periodically and alternately disposed in the Y direction (FIG. 3). The sides of the upper half parts of the p-type column regions PC1 to PC3 are in contact with the p-type semiconductor regions PR1.

Subsequently, the power MOSFETs, the gate lead part GPU, the gate lead electrode GPE, the source lead region SPR, the source lead electrode SPE, the field plate electrodes FFP, and so on are formed on the major surface of the epitaxial layer EPS.

Figure 9:
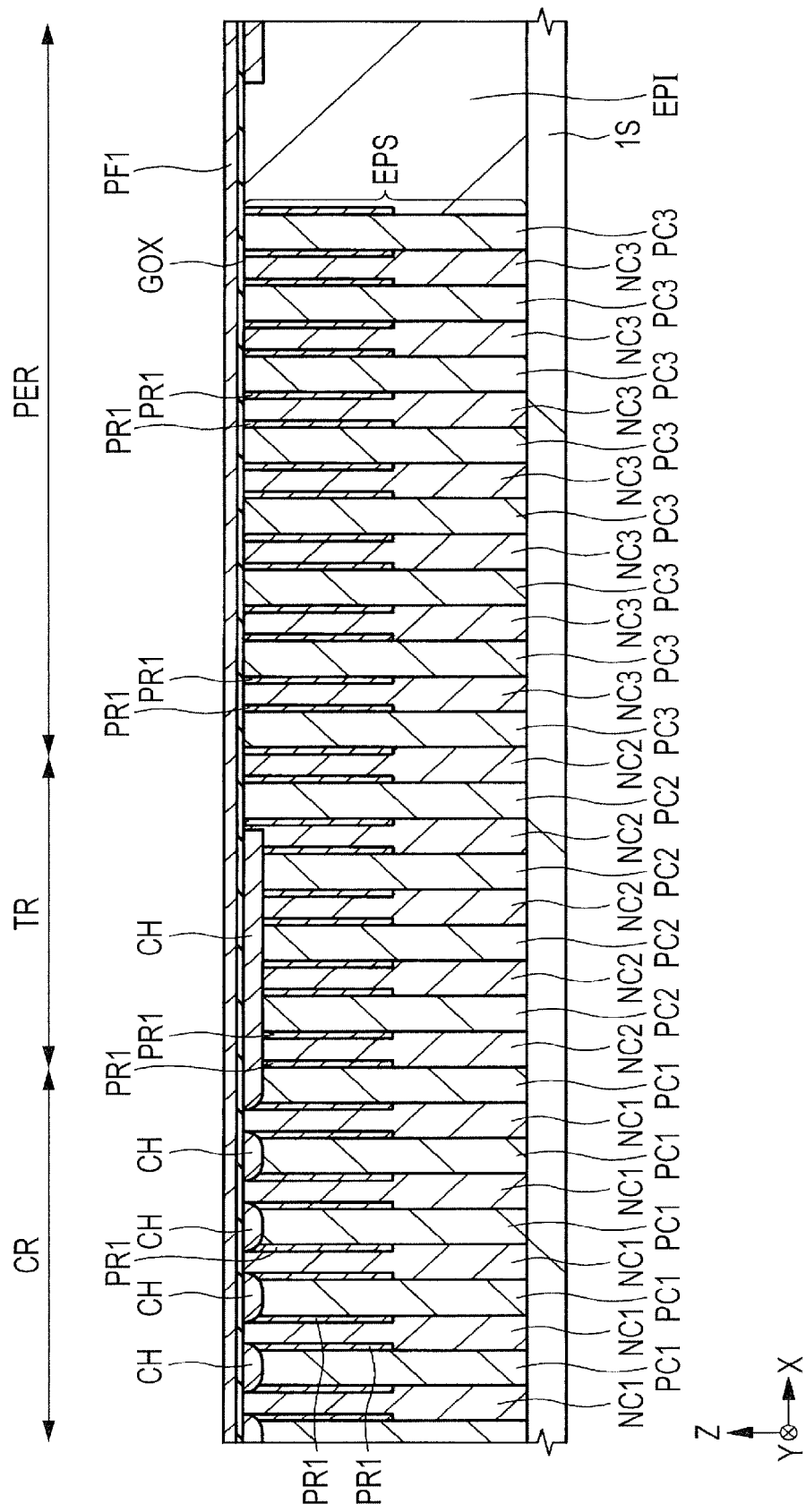
FIG. 9 is a cross-sectional view for explaining the manufacturing process of the semiconductor device subsequent to FIG. 8.

For example, the channel regions CH are formed as shown in FIG. 9. A mask film having openings in the formation regions of the channel region CH is formed by, for example, photolithography and etching. Subsequently, impurity ions are implanted by using the mask film as a mask (implantation prevention mask), forming the channel regions CH. For example, a p-type impurity ion of boron (B) or the like is implanted as the impurity ion. Thus, p-type semiconductor regions can be formed as the channel regions CH.

Subsequently, the mask film is removed, the gate insulating film GOX is formed on the epitaxial layer EPS, and then a conductor film PF1 is formed on the gate insulating film GOX. For example, thermal oxidation on the surface of the epitaxial layer EPS forms a silicon oxide film serving as the gate insulating film GOX. After that, a polycrystalline silicon film is deposited on the silicon oxide film by CVD and so on. The silicon oxide film serving as the gate insulating film GOX may be replaced with a high dielectric film, e.g., a hafnium oxide film having a higher dielectric constant than the silicon oxide film. The gate insulating film GOX may be formed by CVD and so on.

Figure 10:
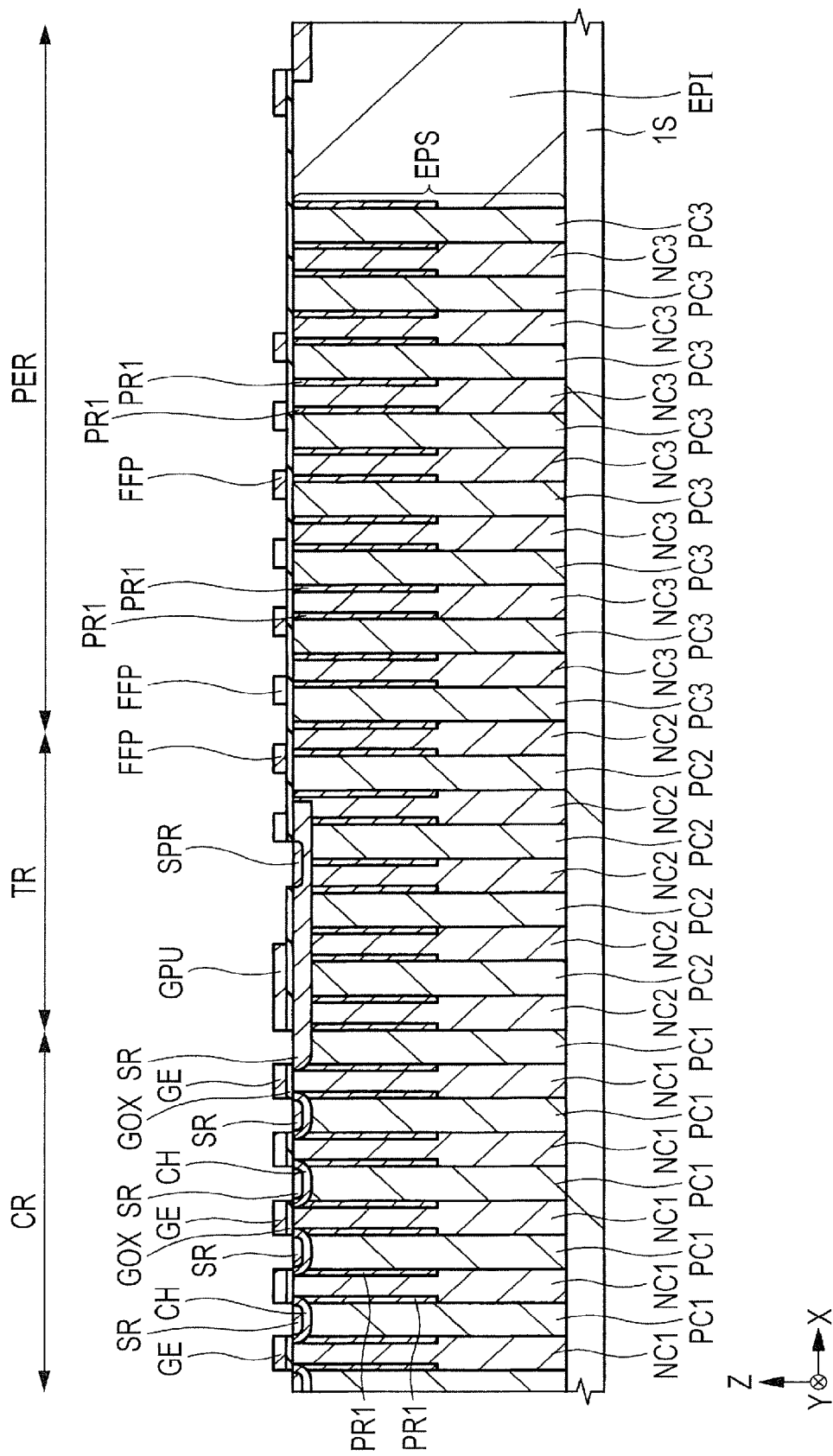
FIG. 10 is a cross-sectional view for explaining the manufacturing process of the semiconductor device subsequent to FIG. 9.

Subsequently, as shown in FIG. 10, the gate electrodes GE are formed on the n-type column regions NC1. Furthermore, the gate lead part GPU is formed in the intermediate region TR. The field plate electrode FFP is formed on the pn junction of the p-type column region PC3 and the n-type column region NC3. For example, on the conductor film PF1, a photoresist film is formed so as to cover the formation regions of the gate electrodes GE, the formation region of the gate lead part GPU, and the formation regions of the field plate electrodes FFP. The conductor film PF1 is etched with the photoresist film serving as a mask.

Thus, the gate electrodes GE, the gate lead part GPU, and the field plate electrodes FFP are formed. For example, the gate electrodes GE are linearly formed like the p-type column regions PC1 and the gate lead part GPU is formed to be electrically coupled to the gate electrodes GE. The field plate electrodes FFP are linearly formed like the p-type column regions PC3. In this configuration, the gate insulating film GOX exposed from the gate electrodes GE in the cell region CR is removed by etching. Also in the intermediate region TR, the gate insulating film GOX is removed by etching in the formation region of the source lead region SPR, which will be discussed later.

Subsequently, the source regions SR and the source lead region SPR are formed. For example, the photoresist film (not shown) covers a region other than the formation region of the source lead region SPR in the peripheral region PER and the intermediate region TR, and then an n-type impurity ion is implanted by using the photoresist film and the gate electrodes GE of the cell region CR as masks. For example, the implanted impurity ion is an n-type impurity ion, e.g., phosphorus (P) or arsenic (As). This can form n-type semiconductor regions serving as the source regions SR between the gate electrodes GE of the cell region CR. Moreover, an n-type semiconductor region serving as the source lead region SPR can be formed in the intermediate region TR. The source regions SR formed in the cell region CR are electrically coupled to the source lead region SPR formed in the intermediate region TR.

Figure 11:
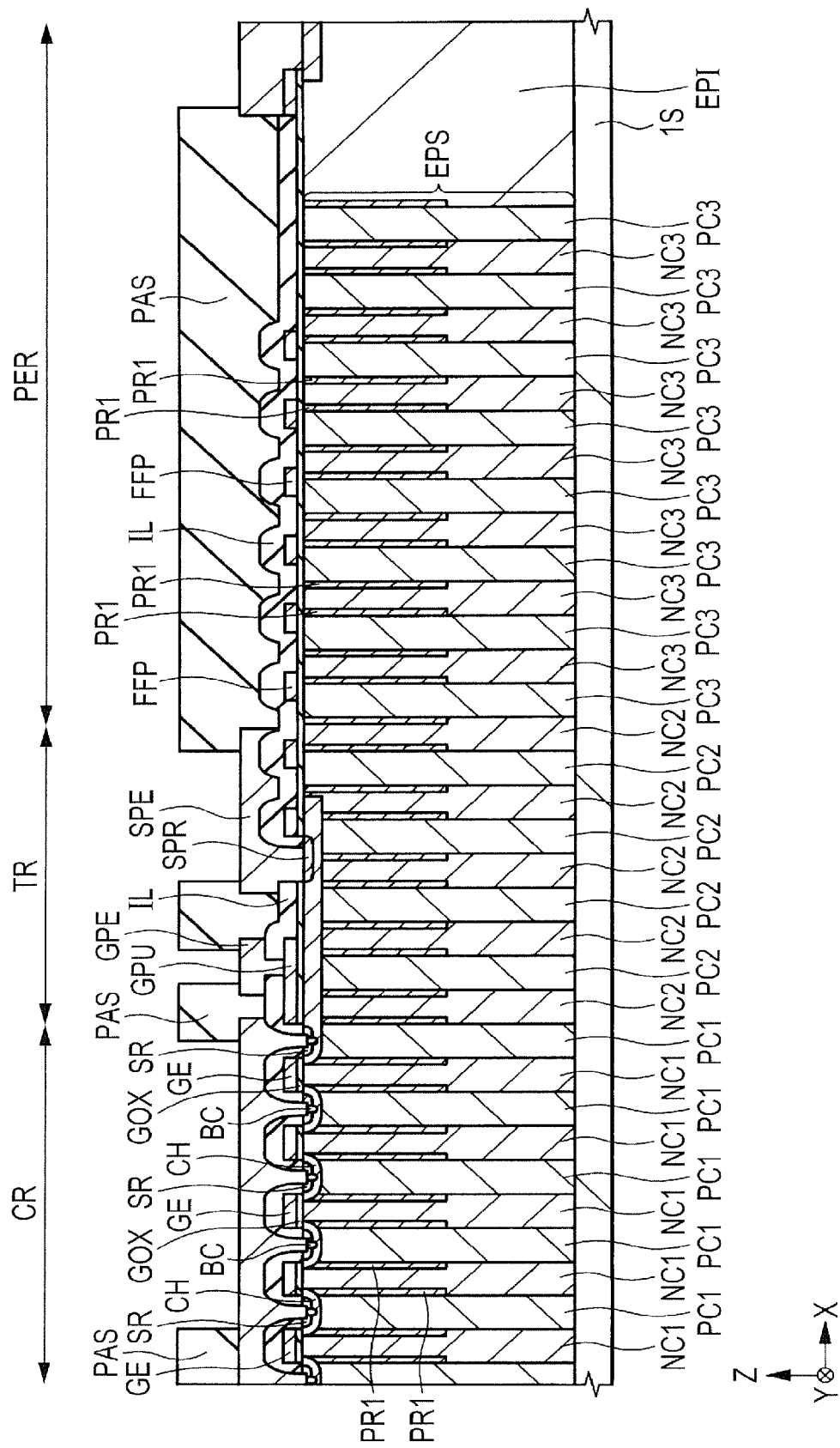
FIG. 11 is a cross-sectional view for explaining the manufacturing process of the semiconductor device subsequent to FIG. 10.

After that, as shown in FIG. 11, the interlayer insulating film IL is formed so as to cover the gate electrodes GE, the gate lead part GPU, and the field plate electrodes FFP. For example, a silicon oxide film is deposited on the gate electrodes GE by CVD. After that, the photoresist film (not shown) having openings on the formation regions of the body contact regions BC, the gate lead part GPU, and the source lead region SPR is formed on the interlayer insulating film IL. Subsequently, with the photoresist film serving as a mask, the interlayer insulating film IL is etched on the source regions SR between the adjacent gate electrodes GE of the cell region CR so as to form the openings. At this point, overetching is performed to set the bottoms of the openings lower than the surface of the epitaxial layer EPS. This exposes the source regions SR from the sides of the bottoms of the openings. The interlayer insulating film IL is etched on the gate lead part GPU and in the source lead region SPR of the intermediate region TR so as to form the openings.

Subsequently, a photoresist film is formed so as to cover the intermediate region TR and the peripheral region PER. With the photoresist film and the interlayer insulating film IL serving as masks, an impurity ion is implanted so as to form the body contact regions BC. For example, the implanted impurity ion is a p-type impurity, e.g., boron (B). This can form the p-type semiconductor regions serving as the body contact regions BC. The body contact region BC is located at the center of the source region SR, and the bottom of the body contact region BC reaches the channel region CH. The body contact region BC has a higher impurity concentration than the channel region CH.

Figure 12:
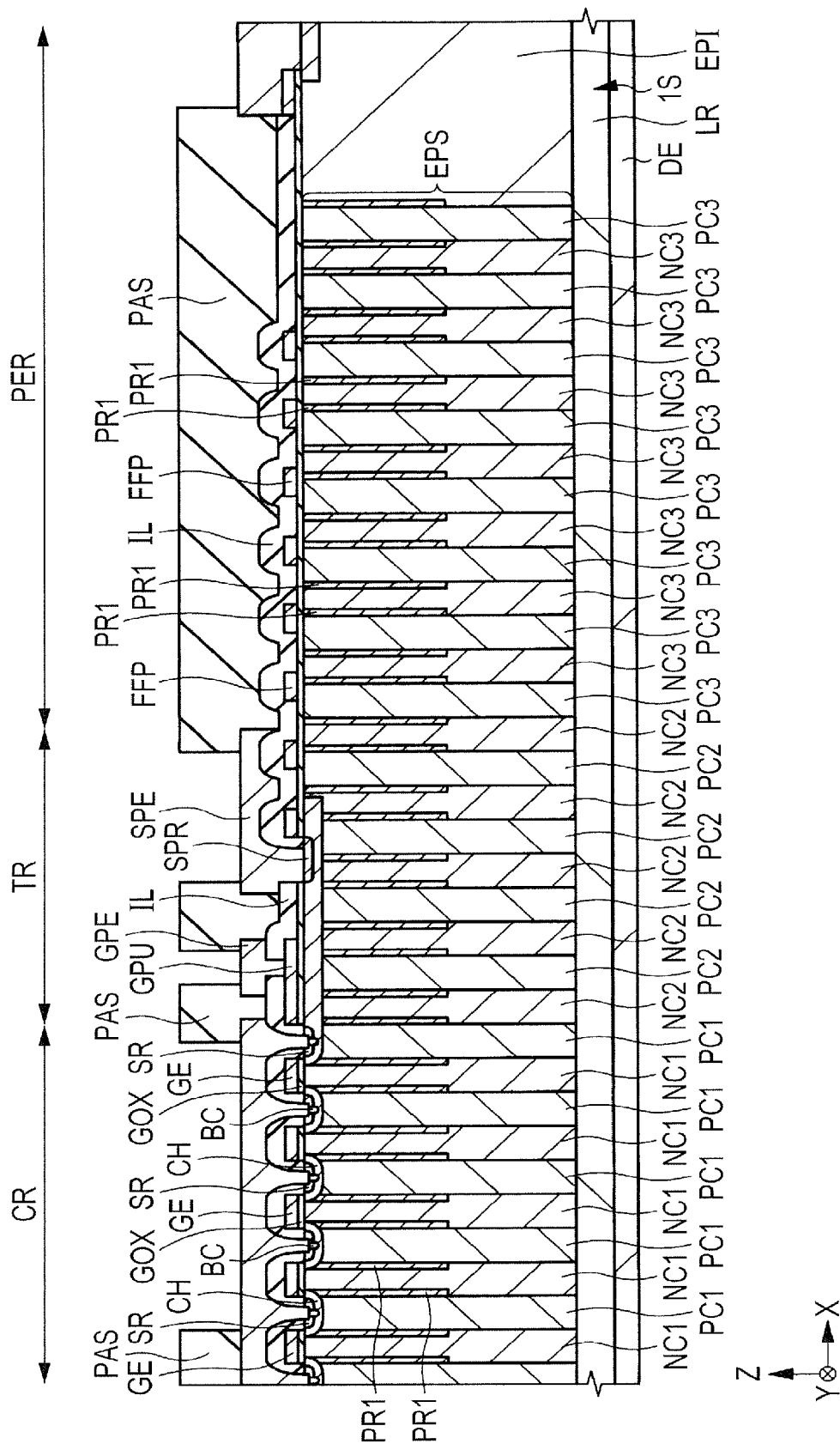
FIG. 12 is a cross-sectional view for explaining the manufacturing process of the semiconductor device subsequent to FIG. 11.

After that, as shown in FIG. 12, the source electrode SE, the gate lead electrode GPE, and the source lead electrode SPE are formed. For example, a metal film is formed on the interlayer insulating film IL as well as on the body contact regions BC, the gate lead part GPU, and the source lead region SPR. For example, a laminated film of a titanium tungsten film and an aluminum film on the titanium tungsten film is formed by sputtering. Subsequently, the metal film is patterned so as to form the source electrode SE, the gate lead electrode GPE, and the source lead electrode SPE. The source electrode SE of the cell region CR is electrically coupled to the source regions SR and the body contact regions BC. The gate lead electrode GPE of the intermediate region TR is electrically coupled to the gate lead part GPU. The source lead electrode SPE of the intermediate region TR is electrically coupled to the source lead region SPR.

Subsequently, the passivation film PAS is formed so as to cover the source electrode SE, the gate lead electrode GPE, and the source lead electrode SPE. For example, a silicon oxide film is deposited on the source electrode SE, the gate lead electrode GPE, and the source lead electrode SPE by CVD. After that, the passivation film PAS is patterned so as to partially expose the source electrode SE, the gate lead electrode GPE, and the source lead electrode SPE. The exposed parts serve as external connection regions (e.g., gate pads and source pads).

After that, an n-type impurity ion is implanted over the back side of the semiconductor substrate 1S so as to form the n-type semiconductor region (low-resistance region) LR. The formation of the n-type semiconductor region LR can reduce a connection resistance between the drain electrode DE, which will be discussed later, and the n-type column regions (NC1, NC2, and NC3). The n-type semiconductor region (low-resistance region) LR extends from the back side of the semiconductor substrate 1S to the bottoms of the grooves (DT1, DT2, and DT3). The n-type semiconductor region LR has an n-type impurity concentration of, for example, about $1.0 \times 10^{16}/cm^3$ and a thickness of, for example, about 1 to 2 μm.

Subsequently, the drain electrode DE is formed on the back side of the semiconductor substrate 1S. For example, a metal film is formed on the back side of the semiconductor substrate 1S by sputtering or evaporation. This can form the drain electrode DE made of a metal film. The gate electrode GE, the source region SR, and the drain electrode DE constitute the power MOSFET.

The semiconductor device of the present embodiment can be formed through the above process.

As has been discussed in the present embodiment, if the p-type column regions (PC1, PC2, and PC3) and the n-type column regions (NC1, NC2, and NC3) are formed by trench filling, the intervals between the p-type column regions and the n-type column regions can be smaller than in "multiepitaxial method." This can reduce an on resistance and increase a withstand voltage. Furthermore, "trench filling" is superior to "multiepitaxial method" in terms of throughput.

<Explanation of the Effect of the Present Embodiment>

Figure 13:
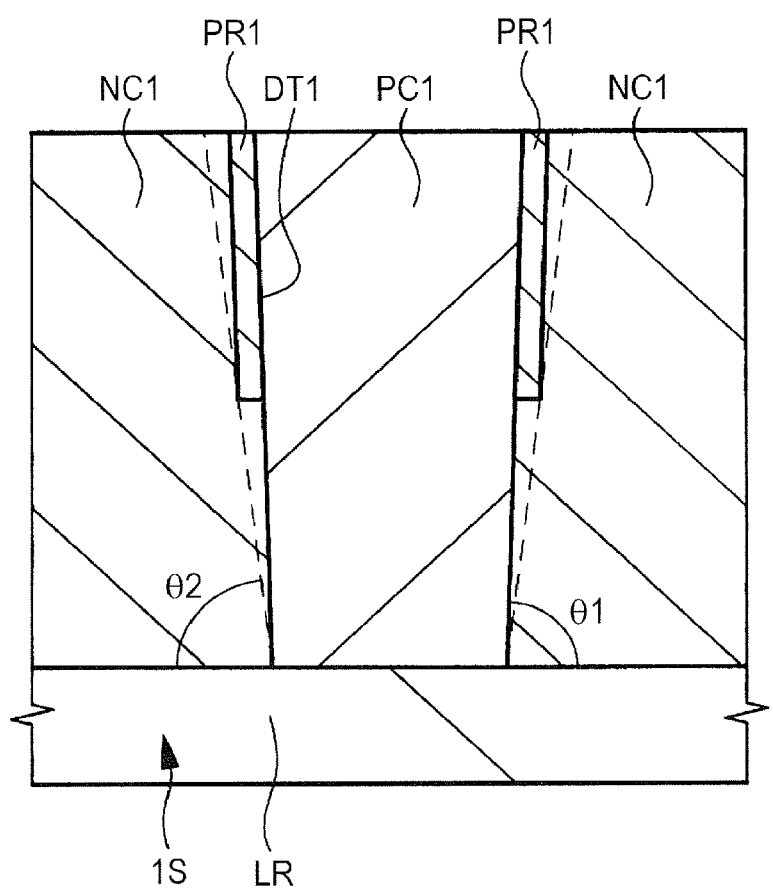
FIG. 13 is an enlarged cross-sectional view showing the semiconductor device according to the first embodiment.
Figure 25:
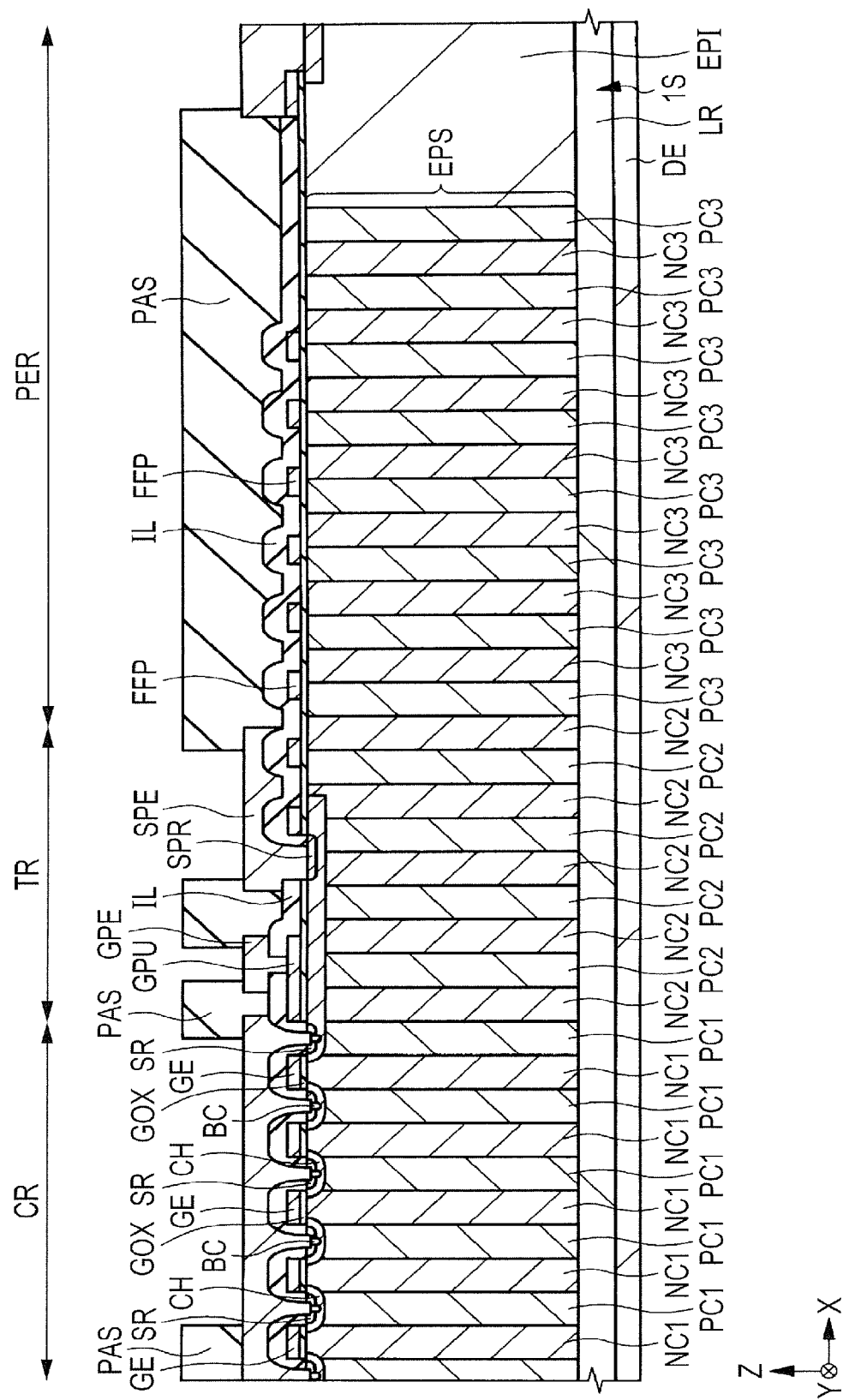
FIG. 25 is a cross-sectional view showing a semiconductor device according to a comparative example.

Referring to FIG. 13 and FIG. 25 showing a semiconductor device of a comparative example, the effect of the present embodiment will be described below. FIG. 13 is an enlarged cross-sectional view showing the semiconductor device of the present embodiment. FIG. 25 is a cross-sectional view showing the semiconductor device of the comparative example. FIG. 13 only shows the semiconductor substrate 1S, the n-type column regions NC1, the p-type column region PC1, and the p-type semiconductor regions PR1, and other structures are omitted. FIG. 25 is a cross-sectional view showing a region corresponding to FIG. 2. The semiconductor device of the comparative example shown in FIG. 25 is different from the semiconductor device of the present embodiment only in the absence of the p-type semiconductor regions PR1 (FIG. 2).

In a vertical power MOSFET having a superjunction structure, it is required to increase a distance (thickness)

between an n-type column region and a p-type column region in the Z direction. This is because an increased distance means an extension of a region that may contain a depletion layer, leading to an increase in the withstand voltage of the power MOSFET. Moreover, in the vertical power MOSFET having the superjunction structure, it is required to reduce the widths of the n-type column region and the p-type column region in the transverse direction (X direction) for the following reason: in addition to a size reduction of the semiconductor device, a reduction in the width of the n-type column region serving as a current path of the power MOSFET allows the n-type column region to easily contain a depletion layer, which extends from the p-type column region opposed to the n-type column region in the X direction, during the off period of the power MOSFET, facilitating the ensuring of a withstand voltage.

As long as the n-type column region and the p-type column region have small widths, the depletion layer can be contained during the off-period of the power MOSFET even if the n-type column region and the p-type column region have high impurity concentrations, thereby keeping a withstand voltage. If an impurity concentration can be increased in the n-type column region serving as a current path of the power MOSFET, the n-type column region can have a lower resistance so as to reduce the on resistance and power consumption of the power MOSFET. This can improve the performance of the semiconductor device. Thus, the performance of the semiconductor device can be improved by increasing the aspect ratios of the n-type column region and the p-type column region.

However, if an epitaxial layer in the grooves formed in the step of FIG. 5 is formed according to the step of epitaxial growth illustrated in FIG. 7, a high aspect ratio of the groove may lead to difficulty in controlling the p-type impurity concentration of the epitaxial layer embedded in the grooves. In other words, it may be difficult to control the impurity concentration of the p-type column region including the epitaxial layer. In the vertical power MOSFET having the superjunction structure, the p-type column region needs to be formed with a p-type impurity concentration within a certain range in order to obtain a desired withstand voltage. This is because an extremely large concentration difference between the adjacent p-type and n-type column regions cannot keep the withstand voltage of the power MOSFET.

In the comparison example of FIG. 25, the aspect ratio of the p-type column region PC1 is increased to 12. For example, the aspect ratios of the p-type and n-type column regions may be increased on the assumption that the p-type column region PC1 has a width of 3 μm in the X direction and the n-type column region NC1 has a width of 3 μm in the X direction. An increase in aspect ratio is likely to vary the concentration of the p-type column region PC1, increasing a possibility that the p-type impurity concentration of the p-type column region PC1 may deviate from a tolerance (charge balance margin). In other words, unfortunately, the semiconductor device may become less reliable and yields may be reduced in the manufacturing process of the semiconductor device. In this case, the charge balance margin is the tolerance of the p-type impurity concentration in the p-type column region PC1. When the p-type column region PC1 has a p-type impurity concentration within the tolerance, a desired withstand voltage of the power MOSFET can be ensured.

The present inventors have found that a charge balance margin is increased when one side of the p-type column region forms a larger angle than in the case where one side of the p-type column region forms an angle close to the vertical direction with respect to the top surface of a semiconductor substrate. In other words, the tolerance of a p-type impurity concentration in the p-type column region with tapered sides is larger than that of the p-type column region in an upright position. This can improve the reliability of the semiconductor device and the yields of the semiconductor device being manufactured. Thus, as long as one side of the p-type column region forms an angle close to the angle of the top surface of the semiconductor substrate 1S, the withstand voltage of the semiconductor device is easily ensured even if an increase in the aspect ratio of the p-type column region may vary the impurity concentration of the p-type column region.

However, if the sides of the grooves formed to be filled with the p-type column regions are formed at angles closer to the angle formed by the top surface of the semiconductor substrate 1S, it is difficult to reduce the widths of the p-type column region and the n-type column region. In the case of an etching method of forming the sides of the grooves at angles close to the vertical direction, it may be difficult to change the etching method.

Thus, as shown in FIG. 2, the p-type semiconductor regions PR1 in the present embodiment are formed in the n-type pillars adjacent to the upper half parts of the sides of the p-type column regions PC1 so as to extend along the sides of the p-type column regions PC1. Since the p-type semiconductor region PR1 constitutes a part of the p-type column region, the structure shown in FIG. 2 allows tapering of the sides of p-type columns. Thus, the top surface of a p-type column region including the p-type column region PC1 and the p-type semiconductor regions PR1 on both sides of the p-type column region PC1 has a larger width than the bottom of the p-type column region in the X direction. In other words, the width of the bottom of the p-type semiconductor region PR1 in the X direction is smaller than a total distance of the width of the top surface of the p-type column region PC1 in the X direction and the widths of the top surfaces of the two p-type semiconductor regions PR1 adjacent to the sides of the p-type column region PC1 in the X direction.

FIG. 13 is an enlarged cross-sectional view showing the p-type column. In FIG. 2, the sides of the p-type column region PC1 extend along the vertical direction. However, as shown in FIG. 13, the actual sides of the p-type column region PC1 are tapered. For example, the angle θ1 formed by one side of the p-type column region PC1 and the top surface of the semiconductor substrate 1S is, for example, 89.3°. An angle θ2 of the p-type column region PC1 and one side of the p-type column region PC1 including the semiconductor regions PR1 is, for example, 89.0°.

FIG. 13 shows the p-type column region PC1 and the effective sides of the p-type column region PC1 including the p-type semiconductor regions PR1. A broken line indicates the position of a plane connecting the lower end (corner) of the p-type column region PC1 and the lower end (corner) of the p-type semiconductor region PR1. In other words, in the present embodiment, the p-type semiconductor region PR1 is formed with one end in contact with the broken line. The p-type semiconductor region PR1 is formed within the broken line.

The p-type semiconductor regions PR1 are formed such that the top surface of the p-type column region is substantially larger in width than the bottom of the p-type column region in the X direction. Thus, the angle θ2 of one side of the p-type column region can be smaller than the angle θ1. In other words, the angle formed by one side of the p-type column region and the bottom of the p-type column region can be increased, so that the angle of one side of the p-type column region becomes closer to that of the top surface of the semiconductor substrate 1S.

Thus, as shown in FIG. 2, without changing the shapes of the grooves DT1 (FIG. 5) formed to be filled with the p-type column regions PC1, the p-type semiconductor regions PR1 formed as parts of the p-type column region can increase the tolerance of a p-type impurity concentration in the p-type column region PC1. This can easily increase the aspect ratio of the p-type column region while ensuring the withstand voltage of the semiconductor device. Thus, the vertical power MOSFET having the superjunction structure can have a higher withstand voltage and a lower resistance, thereby improving the performance of the semiconductor device.

In the semiconductor device of the present embodiment, the grooves DT1 to DT3 shown in FIG. 5 are filled with the epitaxial layer EP (FIG. 7), which is made of silicon (Si) like the epitaxial layer EPI, instead of an insulating film. This configuration prevents the occurrence of a stress between different materials. In the grooves DT1 to DT3, a silicon film can increase the withstand voltage of the semiconductor element as compared with an insulating film.

<Modification>

Figure 14:
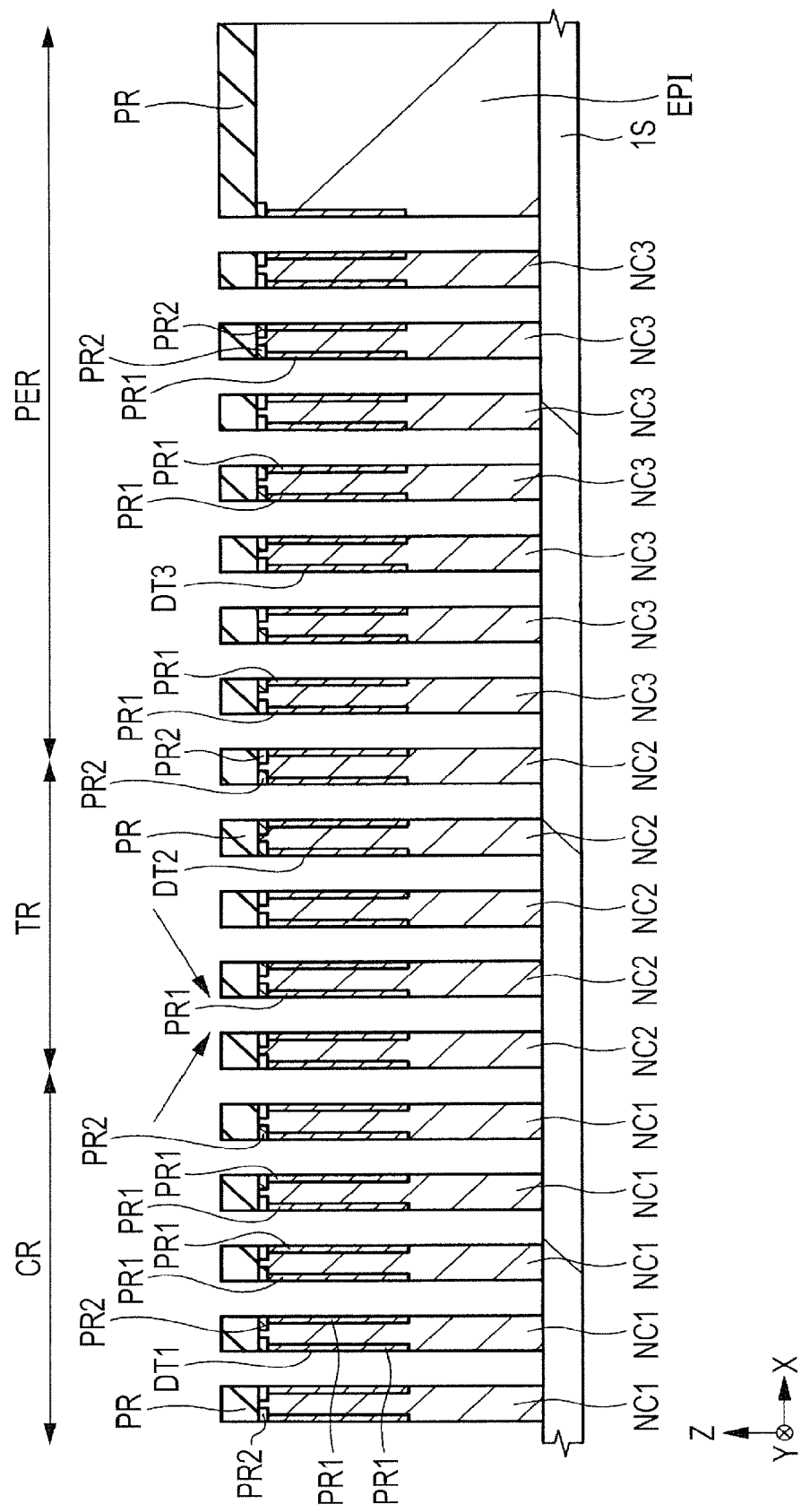
FIG. 14 is a cross-sectional view showing the manufacturing process of a semiconductor device according to a modification of the first embodiment.
Figure 15:
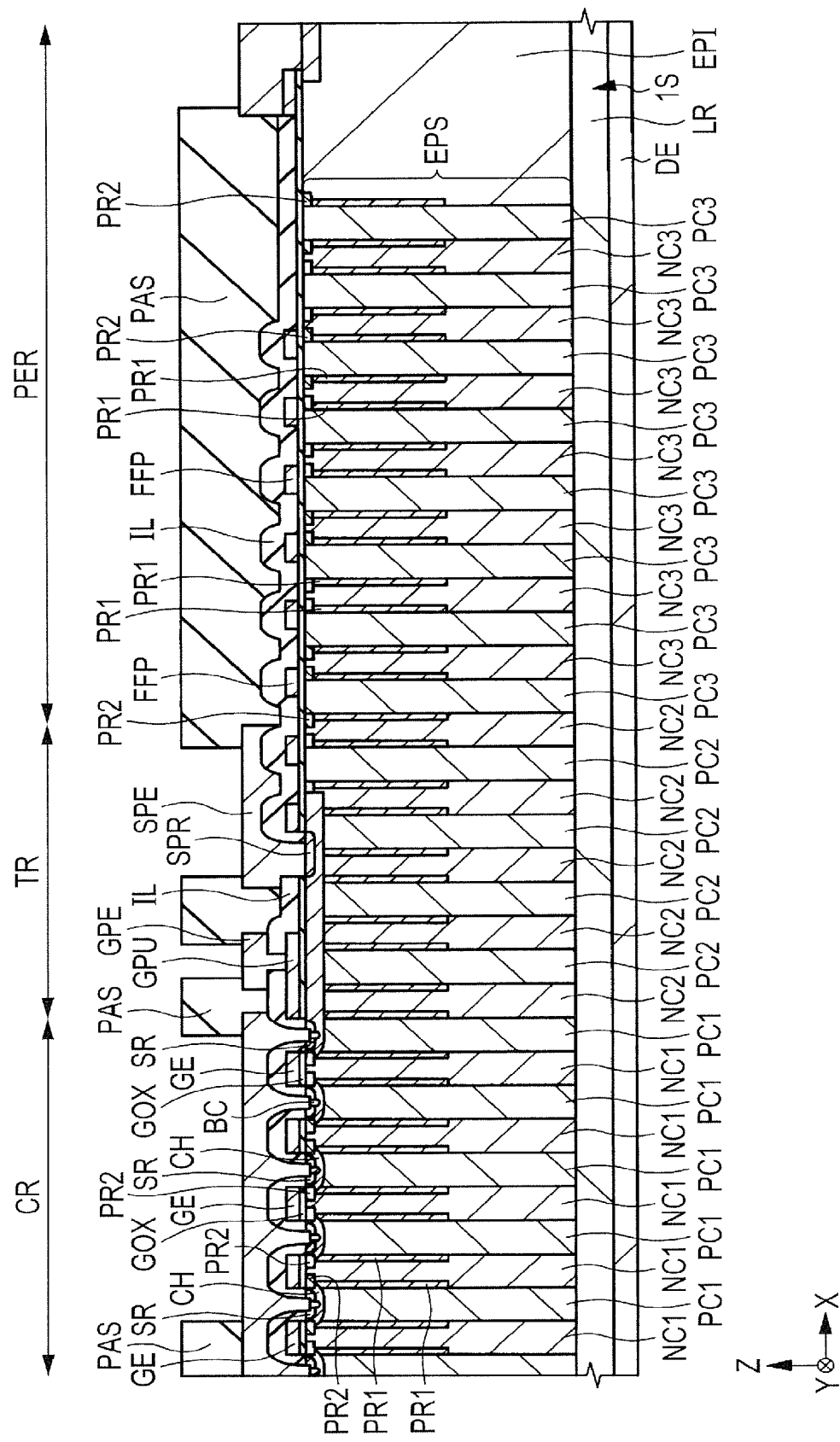
FIG. 15 is a cross-sectional view for explaining the manufacturing process of the semiconductor device subsequent to FIG. 14.

Referring to FIGS. 14 and 15, a semiconductor device and a method of manufacturing the same according to a modification of the first embodiment will be described below. FIGS. 14 and 15 are cross-sectional views showing the manufacturing process of the semiconductor device according to the modification of the first embodiment. In the following explanation, p-type semiconductor regions are formed on the top surface of the epitaxial layer to improve an avalanche breakdown resistance.

In the manufacturing process of the semiconductor device according to the present modification, as shown in FIG. 14, p-type semiconductor regions PR2 are formed near the upper ends of the sides of grooves DT1 to DT3 by diagonal ion implantation of a p-type impurity (e.g., boron (B)) after the steps of FIGS. 4 to 6. The p-type semiconductor regions PR2 are formed on the top surface of an epitaxial layer EPI and the upper ends of the sides of the grooves DT1 to DT3. The p-type semiconductor region PR2 has a higher impurity concentration and a smaller depth than a p-type semiconductor region PR1. In an n-type pillar, an n-type column region NC1 is formed between the p-type semiconductor regions PR2 formed on both sides of the n-type pillar in the X direction. The p-type semiconductor region PR2 has a larger width than the p-type semiconductor region PR1 in the X direction. In this configuration, ion implantation is performed to form the p-type semiconductor regions PR2 on the top surface of the epitaxial layer EPI instead of the sides of the grooves DT1 to DT3.

The subsequent steps are similar to those of FIGS. 7 to 12. This can form the semiconductor device of the present modification shown in FIG. 15. In the above explanation, the p-type semiconductor regions PR2 are formed after the formation of the p-type semiconductor regions PR1. After the step of FIG. 5, the p-type semiconductor regions PR2 may be formed before the step of FIG. 6 (the step of forming the p-type semiconductor regions PR1). In a cell region CR of FIG. 15, the p-type semiconductor regions PR2 overlap channel regions CH. In an intermediate region TR, the p-type semiconductor regions PR2 overlapping the channel regions CH are not illustrated for the sake of simplification.

In the present modification, the formation of the p-type semiconductor regions PR2 increases a p-type impurity concentration on the upper ends of the sides of the p-type column regions. An avalanche breakdown is likely to occur at a pn junction on the top surface of an epitaxial layer EPS. Even if an avalanche breakdown occurs with a large number of carriers, the p-type semiconductor regions PR2 serving as neutral regions with high impurity concentrations are formed on the top surface of the epitaxial layer EPS, so that the p-type semiconductor regions PR2 absorb the carriers. This can prevent a break caused by an avalanche breakdown. In other words, an avalanche breakdown resistance can be improved.

(Second Embodiment)

Figure 16:
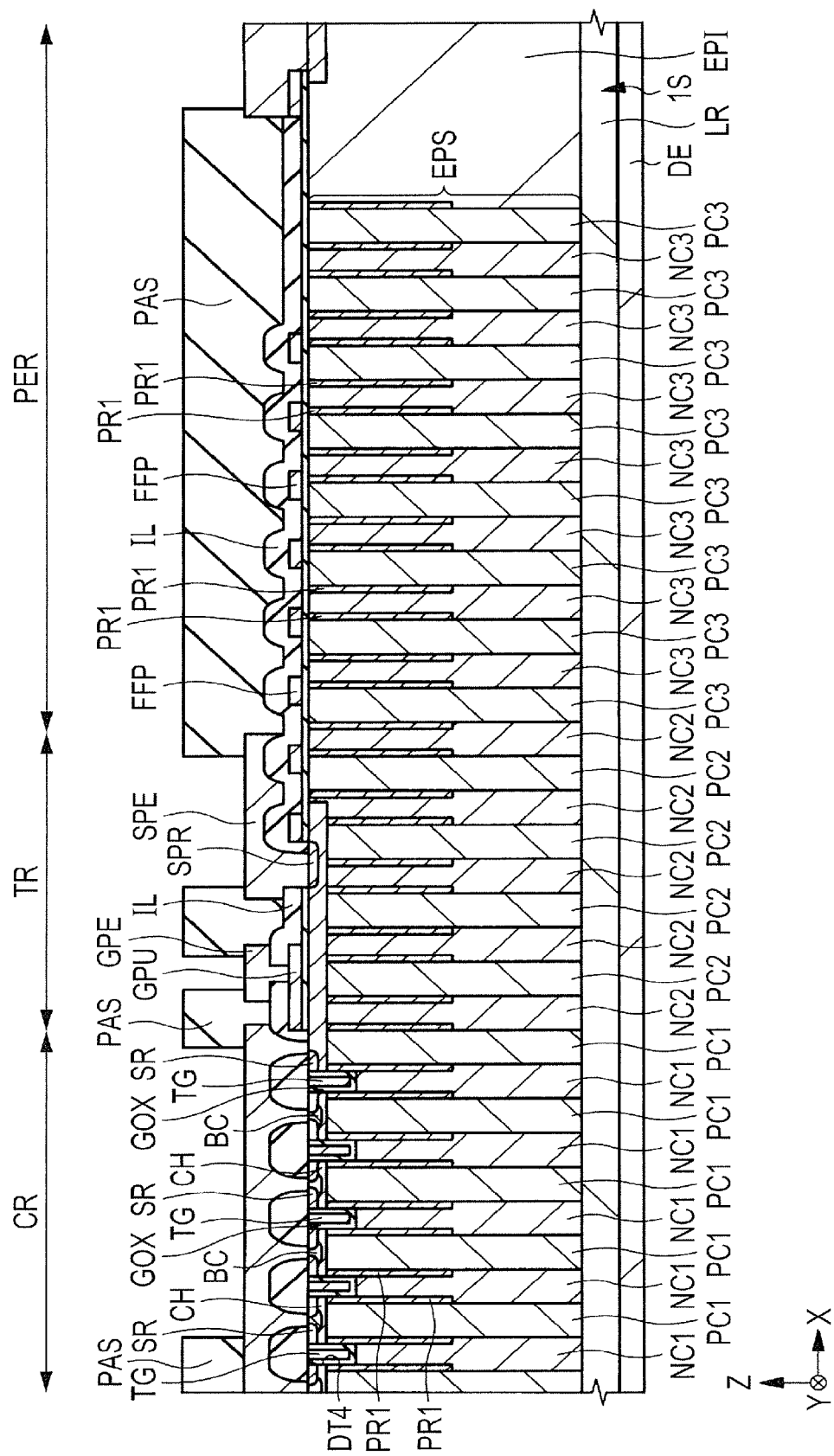
FIG. 16 is a cross-sectional view showing the configuration of a semiconductor device according to a second embodiment.

The planar power MOSFET formed in the first embodiment includes the gate electrodes formed on the flat top surface of the epitaxial layer with the gate insulating film interposed between the gate electrodes and the epitaxial layer. The power MOSFET may be a trench MOSFET including trench gate electrodes embedded in grooves formed on the top surface of an epitaxial layer. Referring to FIGS. 16 to 22, a semiconductor device according to a second embodiment and a method of manufacturing the same will be described below. FIG. 16 is a cross-sectional view showing the semiconductor device according to the second embodiment. FIGS. 17 to 22 are cross-sectional views showing the manufacturing process of the semiconductor device according to the second embodiment.

As shown in FIG. 16, the semiconductor device of the present embodiment is a vertical power MOSFET having a superjunction structure with trench gate electrodes. The configurations of a drain electrode DE, a semiconductor substrate 1S, an epitaxial layer EPS, and a p-type semiconductor region PR1 are similar to those of the first embodiment. In a cell region CR, grooves DT4 are formed on the top surfaces of n-type column regions NC1 also serving as the top surface of the epitaxial layer EPS. In the groove DT4, a trench gate electrode TG is formed with a gate insulating film GOX interposed between the groove DT4 and the gate electrode TG. The grooves DT4 and the gate electrodes TG are patterned so as to extend in the Y direction. A channel region CH having a smaller depth than the gate electrode TG is formed on the top surface of the epitaxial layer EPS between the grooves DT4 adjacent to each other in the X direction. The gate insulating film GOX includes, for example, a silicon oxide film. The gate electrode TG includes, for example, a polysilicon film. The channel region CH is a p-type semiconductor region.

On the top surface of the channel region CH, a body contact region BC serving as a p-type semiconductor region is formed at a smaller depth than the channel region CH. Between the body contact region BC and the groove DT4, a source region SR serving as an n-type semiconductor region is formed on the top surface of the channel region CH. In other words, on the top surface of the epitaxial layer EPS between the grooves DT4 adjacent to each other in the X direction, the source region SR, the body contact region BC, and the source region SR are sequentially disposed. The gate electrode TG, the source regions SR, and the drain electrode DE constitute the trench gate power MOSFET.

The structures of an intermediate region TR and a peripheral region PER are similar to those of the first embodiment. Moreover, a structure on the epitaxial layer EPS of the cell region CR is similar to that of the first embodiment except for the absence of the gate insulating film GOX and the gate electrode GE (FIG. 2) on the epitaxial layer EPS. Specifically, an interlayer insulating film IL is formed on the epitaxial layer EPS of the cell region CR, and a source electrode SE penetrating the interlayer insulating film IL is coupled to the top surfaces of the source regions SR and the body contact regions BC.

Referring to FIGS. 17 to 22, the method of manufacturing the semiconductor device according to the present embodiment will be described below. FIGS. 17 to 22 are cross-sectional views showing the manufacturing process of the semiconductor device according to the second embodiment.

First, the epitaxial layer EPS is formed on a semiconductor substrate 1S through the steps of FIGS. 4 to 8.

Figure 17:
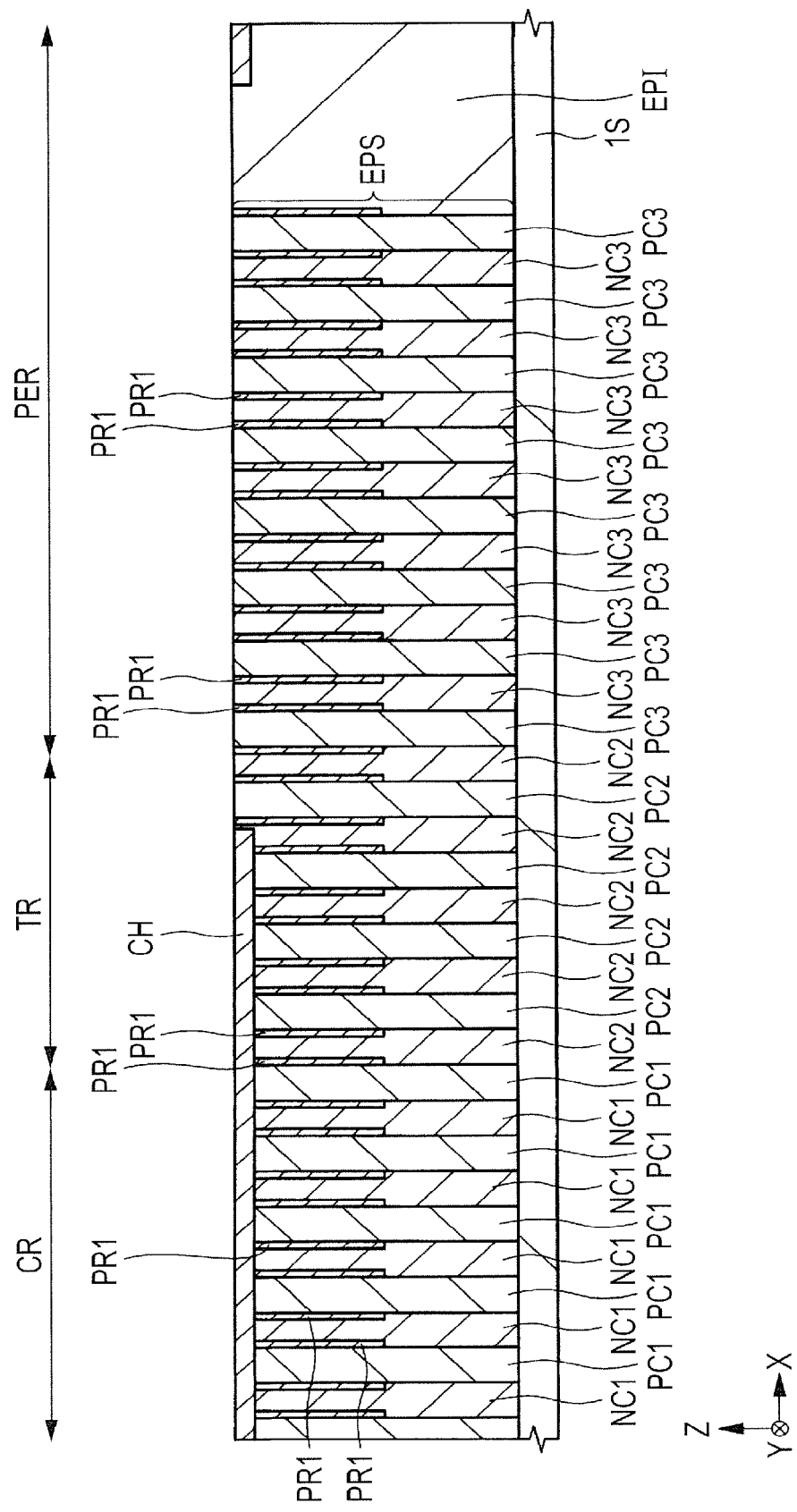
FIG. 17 is a cross-sectional view showing the manufacturing process of the semiconductor device according to the second embodiment.

Subsequently, as shown in FIG. 17, a p-type impurity (e.g., boron (B)) is implanted by photolithography and ion implantation so as to form the channel region CH on the top surface of the epitaxial layer EPS in the cell region CR and the intermediate region TR. The channel region CH has a smaller depth than p-type semiconductor regions PR1.

Figure 18:
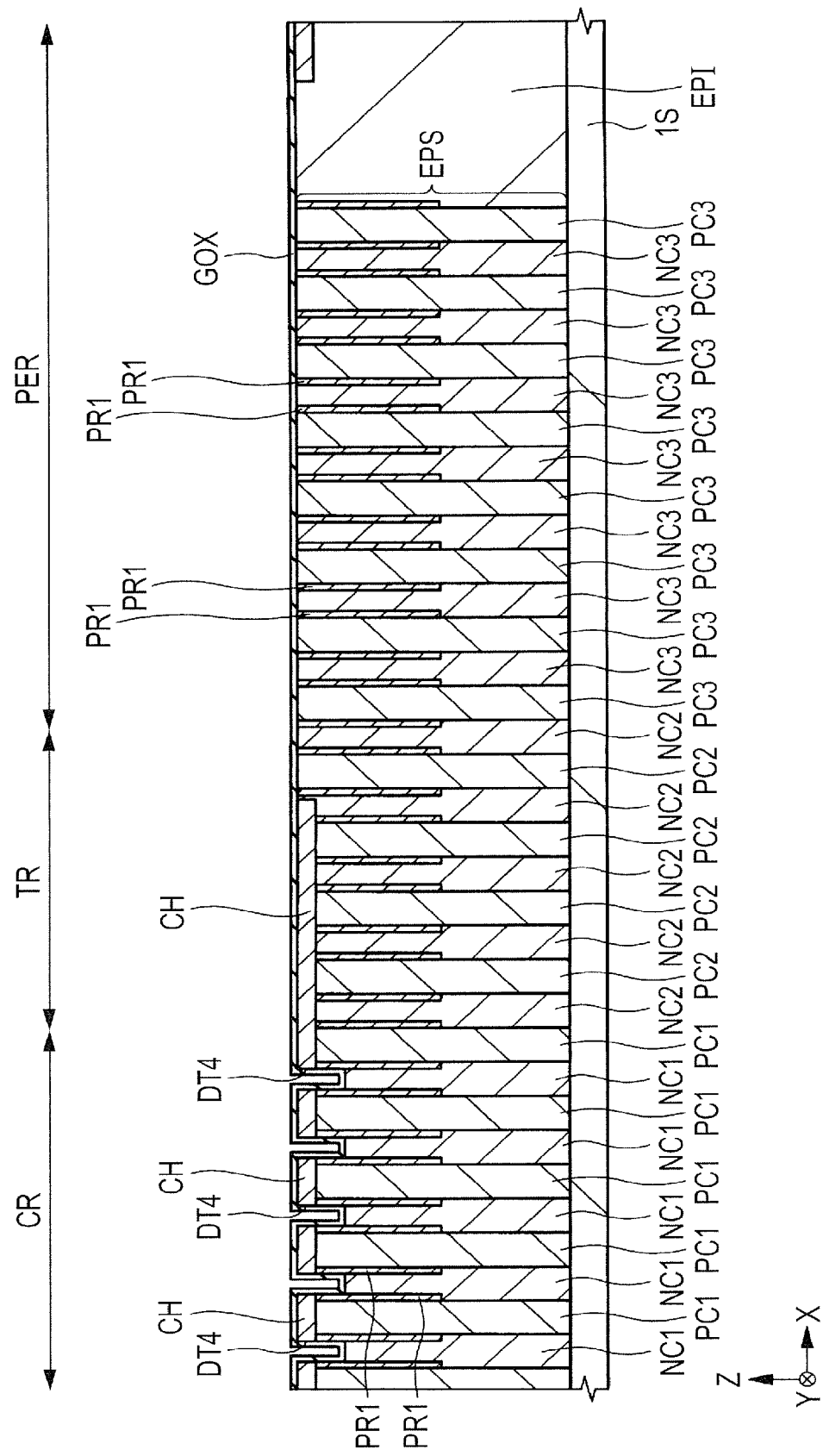
FIG. 18 is a cross-sectional view for explaining the manufacturing process of the semiconductor device subsequent to FIG. 17.

After that, as shown in FIG. 18, the grooves DT4 are formed on the top surfaces of the n-type column regions NC1 by photolithography and dry etching. The grooves DT4 are larger in depth than the channel region CH and are smaller in depth than the p-type semiconductor regions PR1. The grooves DT4 are not formed on the top surfaces of n-type column regions NC2 and NC3. The gate insulating film GOX including, for example, a silicon oxide film is then formed on the surface of the epitaxial layer EPS. The gate insulating film GOX is formed by, for example, thermal oxidation. The gate insulating film GOX is formed over the top surface of the epitaxial layer EPS and the sides and bottoms of the grooves DT4.

Figure 19:
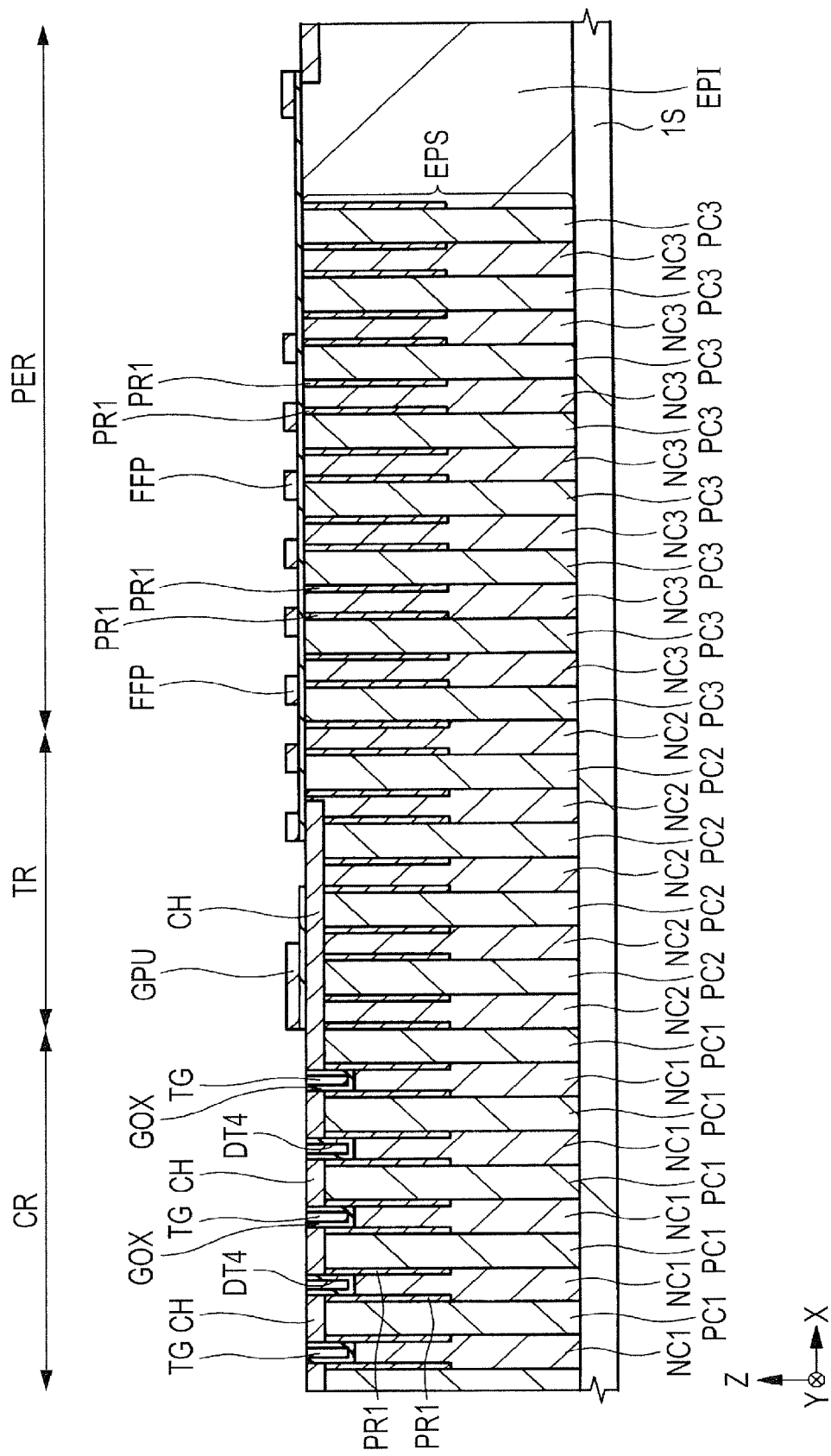
FIG. 19 is a cross-sectional view for explaining the manufacturing process of the semiconductor device subsequent to FIG. 18.

Subsequently, as shown in FIG. 19, a gate electrode is formed in the groove DT4 with the gate electrode TG interposed between the groove DT4 and the gate electrode GE. Moreover, a gate lead part GPU is formed in the intermediate region TR. Furthermore, a field plate electrode FFP is formed on a pn junction of a p-type column region PC3 and the n-type column region NC3. In this configuration, a conductor film including, for example, a polysilicon film is formed on the epitaxial layer EPS by CVD and so on. After that, a photoresist film is formed so as to cover the formation region of the gate lead part GPU and the formation regions of the field plate electrodes FFP. The conductor film is etched with the photoresist film serving as a mask. Thus, the gate electrodes TG, the gate lead part GPU, and the field plate electrodes FFP are formed.

At this point, in the cell region CR, the conductor film is completely removed on the top surface of the epitaxial layer EPS and remains only in the grooves DT4 as the gate electrodes TG. Moreover, the gate insulating film GOX is removed outside the grooves DT4, thereby exposing the top surface of the epitaxial layer EPS. This can leave the gate insulating film GOX and the gate electrodes TG in the grooves DT4.

Figure 20:
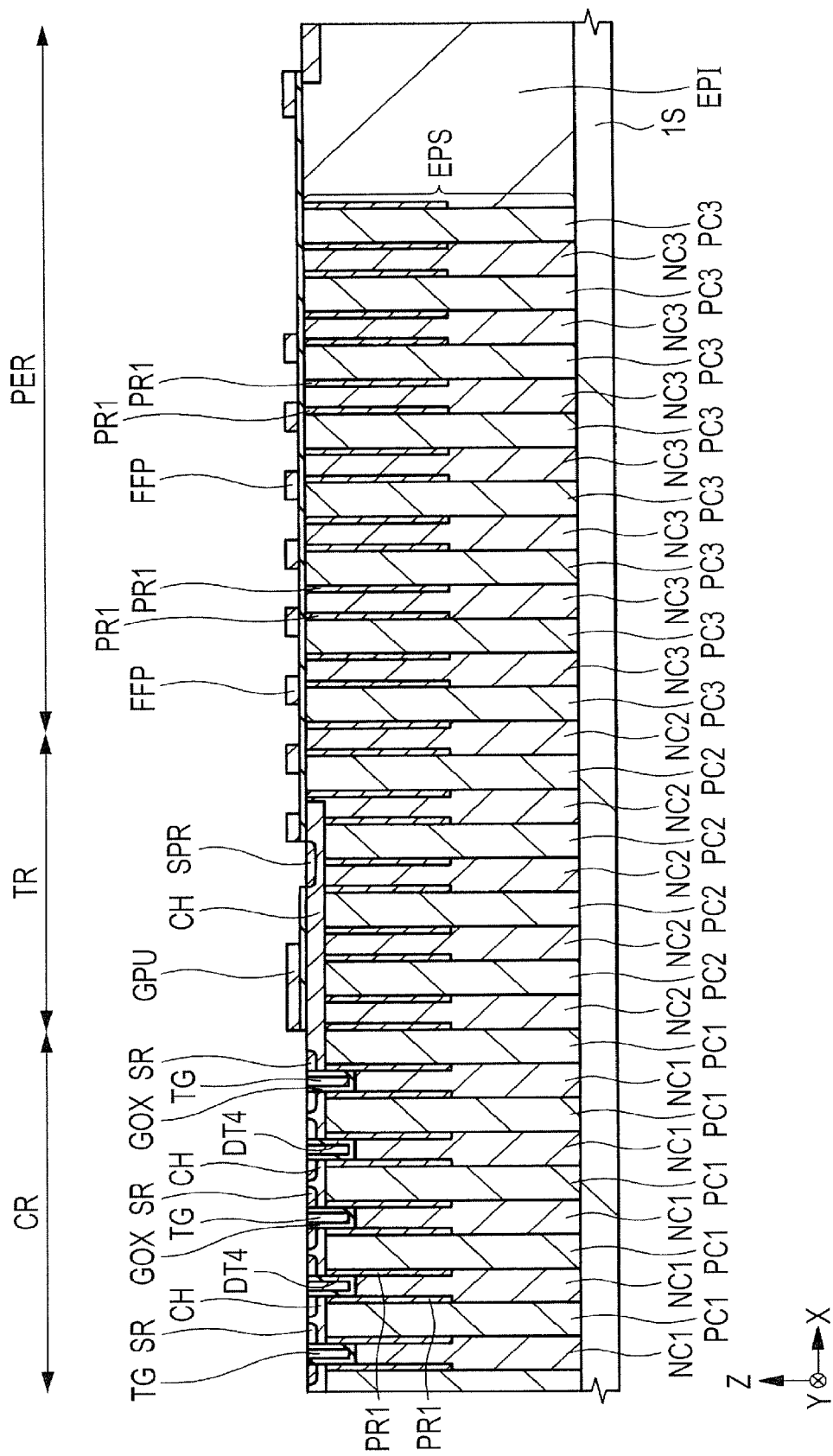
FIG. 20 is a cross-sectional view for explaining the manufacturing process of the semiconductor device subsequent to FIG. 19.

Subsequently, as shown in FIG. 20, an n-type impurity (e.g., phosphorus (P) or arsenic (As)) is implanted to the top surface of the channel region CH in the cell region CR by photolithography and ion implantation, forming the source regions SR serving as n-type semiconductor regions at a smaller depth than the channel region CH. In this case, the source regions SR are formed next to the groove DT4 in the X direction. However, the source regions SR adjacent to the grooves DT4 are separated from each other between the adjacent grooves DT4.

Figure 21:
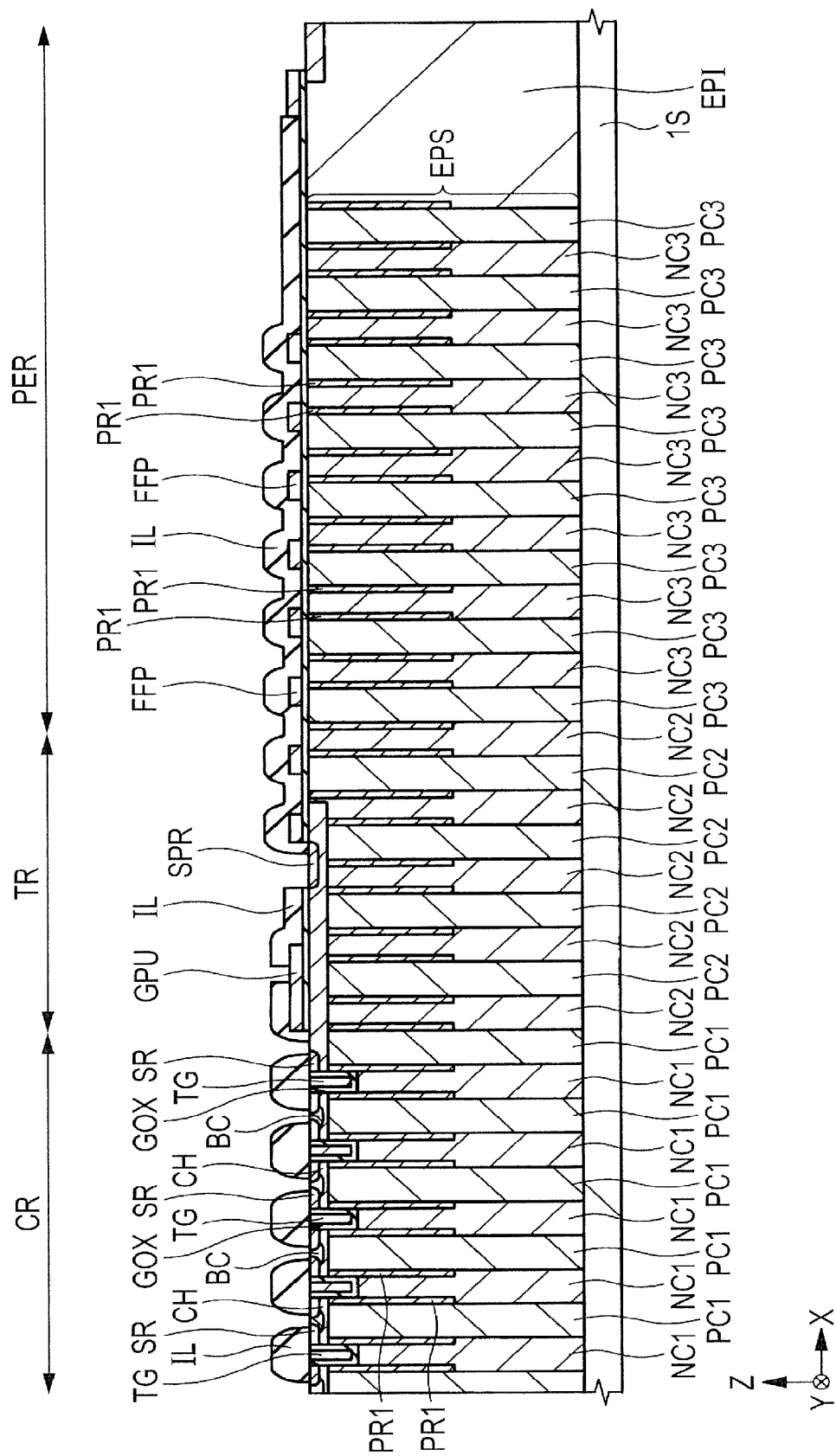
FIG. 21 is a cross-sectional view for explaining the manufacturing process of the semiconductor device subsequent to FIG. 20.

After that, as shown in FIG. 21, the same step as in FIG. 11 is performed to form the interlayer insulating film IL and the body contact regions BC. The body contact regions BC are larger in depth than the source regions SR and are smaller in depth than the channel regions CH. Between the adjacent grooves DT4, the body contact region BC is formed at a position separated from the grooves DT4. In other words, between the adjacent grooves DT4, the body contact region BC is formed on the top surface of the channel region CH between the adjacent source regions SR.

Figure 22:
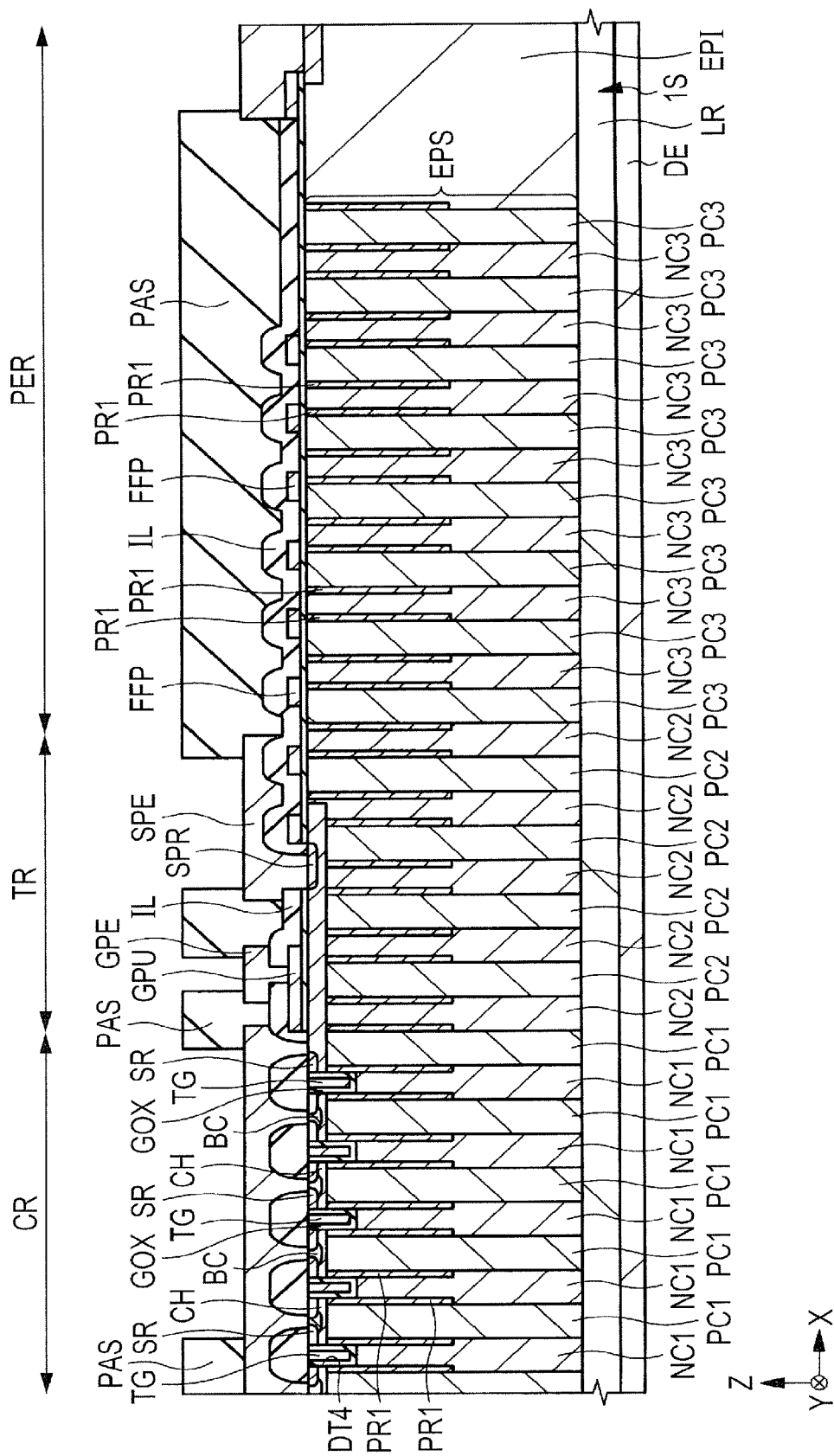
FIG. 22 is a cross-sectional view for explaining the manufacturing process of the semiconductor device subsequent to FIG. 21.

Subsequently, as shown in FIG. 22, the same step as in FIG. 12 is performed to form the source electrode SE, a gate lead electrode GPE, a source lead electrode SPE, an n-type semiconductor region (low-resistance region) LR, and the drain electrode DE. The gate electrode TG, the source regions SR, and the drain electrode DE constitute the trench gate power MOSFET. Thus, the semiconductor device of the present embodiment can be formed.

According to the present embodiment, also in the trench gate power MOSFET having the superjunction structure, the sides of the p-type column region can be tapered by forming the p-type semiconductor regions PR1 adjacent to the p-type column region PC1. Thus, the same effect as in the first embodiment can be obtained.

(Third Embodiment)

In the first embodiment, the p-type semiconductor region is formed on each side of the groove by one-time ion implantation in the n-type pillar as a part of the p-type column region. This substantially inclines the sides of the p-type column region. In a third embodiment, ion implantation is performed two or more times to form a plurality of p-type semiconductor regions on each side of a groove.

Figure 23:
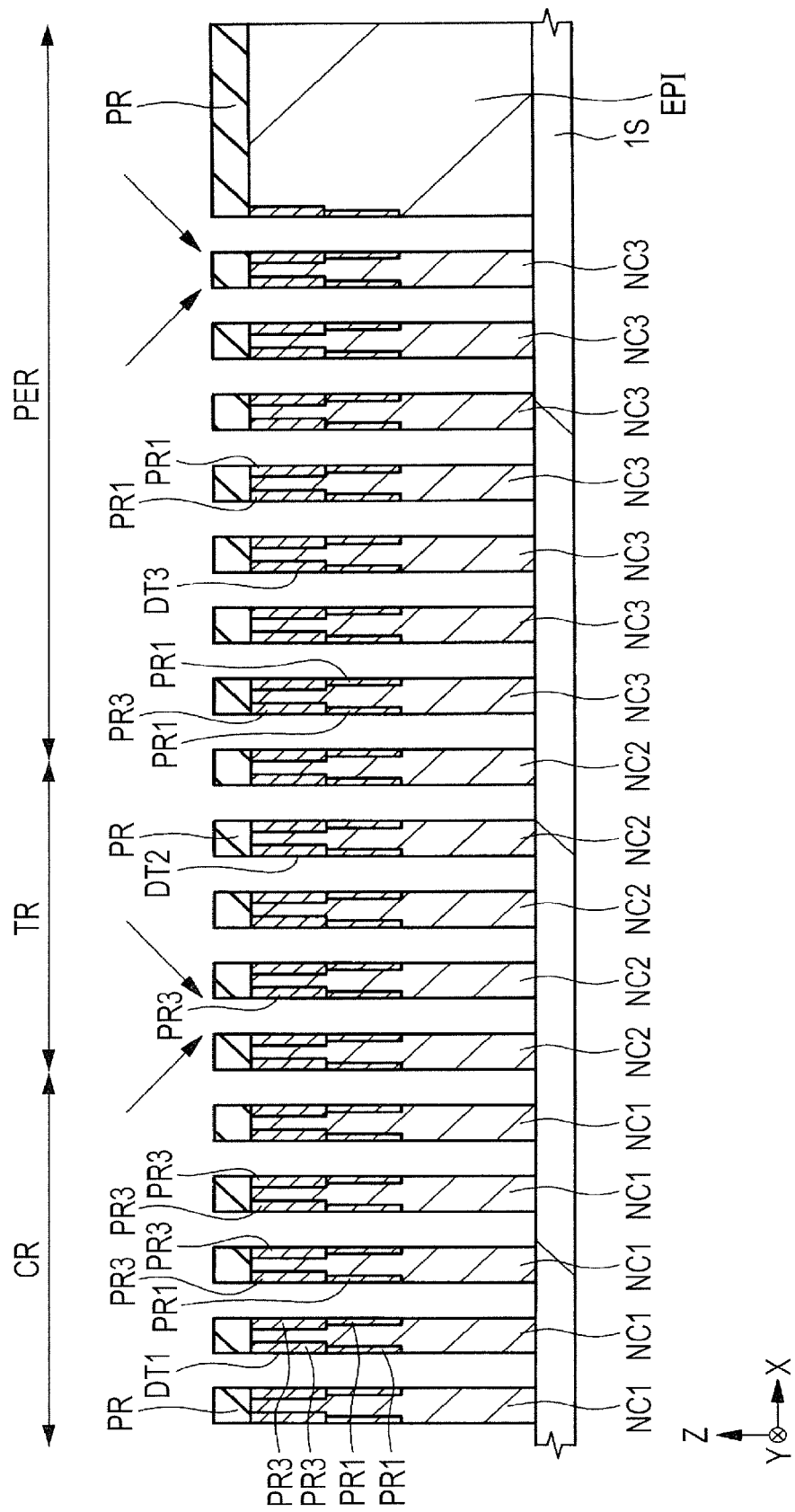
FIG. 23 is a cross-sectional view showing the manufacturing process of a semiconductor device according to a third embodiment.
Figure 24:
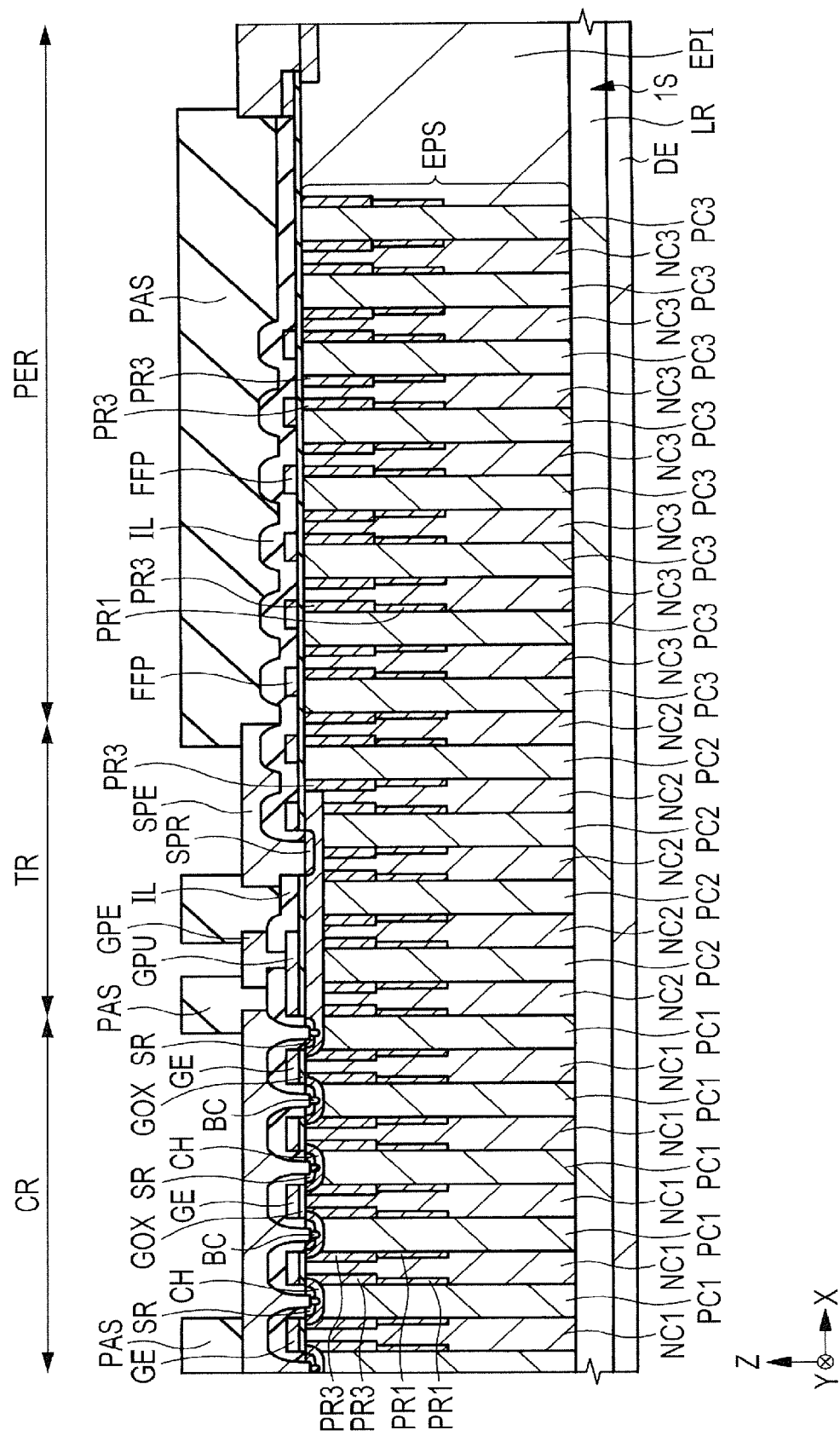
FIG. 24 is a cross-sectional view for explaining the manufacturing process of the semiconductor device subsequent to FIG. 23.

Referring to FIGS. 23 and 24, a semiconductor device according to the third embodiment and a method of manufacturing the same will be described below. FIGS. 23 and 24 are cross-sectional views showing the manufacturing process of the semiconductor device according to the third embodiment.

In the manufacturing process of the semiconductor device according to the present embodiment, first, the steps of FIGS. 4 to 6 are performed to form grooves DT1 to DT3 that penetrate an epitaxial layer EPI on a semiconductor substrate 1S and then p-type semiconductor regions PR1.

Subsequently, as shown in FIG. 23, ion implantation is performed on the sides of the grooves DT1 to DT3 diagonally with respect to the top surface of the semiconductor substrate 1S with a photoresist film PR serving as a mask. This forms p-type semiconductor regions PR3 on the sides of the grooves DT1 to DT3. Specifically, in this configuration, an impurity (e.g., boron (B)) is diagonally implanted to the epitaxial layer EPI. Thus, on the sides of the grooves DT1 to DT3, for example, an impurity is not implanted to a region at three-fourths of a height from the lower end to the upper end of the groove but the impurity is implanted to a region at, for example, a quarter of a height from the upper end to the lower end of the groove. The impurity is not implanted to the bottoms of the grooves DT1 to DT3.

Thus, the p-type semiconductor regions PR3 are formed from the upper ends of the sides of the grooves DT1 to DT3 to a certain depth of the sides of the grooves DT1 to DT3. The p-type semiconductor region PR3 has a smaller depth than the p-type semiconductor region PR1. Specifically, the p-type semiconductor regions PR3 are formed from the top surface of the epitaxial layer EPI to a depth equivalent to about a quarter of a height from the upper end to the lower end of each of the grooves DT1 to DT3. The p-type semiconductor region PR3 has a depth of, for example, 15 µm in the Z direction from the upper end to the lower end of the groove. In other words, in this configuration, the p-type semiconductor regions PR3 are formed from the height of the upper end of an n-type column region NC1 to a position at a quarter of the height of the n-type column region NC1.

The implantation conditions of the ion implantation step include, for example, implantation energy of 40 keV and a dose of $1.0 \times 10^{11}/cm^2$-$3.0 \times 10^{11}/cm^2$. Moreover, implantation is performed at an angle of 9° formed from the vertical direction (Z direction) in the X direction (the transverse direction of the n-type pillar). In other words, the angle of diagonal implantation for forming the p-type semiconductor regions PR1 is closer to a right angle with respect to the top surface of the semiconductor substrate 1S (the top surface of the epitaxial layer EPI) as compared with the angle of diagonal implantation for forming the p-type semiconductor regions PR3. In this case, after the diagonal implantation at 9°, implantation is performed at 9° also on the opposite side with respect to the vertical direction. Thus, the p-type semiconductor regions PR3 are formed on the upper parts of both sides of the n-type pillars in the transverse direction.

The p-type semiconductor region PR3 is larger in width than the p-type semiconductor region PR1 in the X direction. In other words, the p-type semiconductor regions PR3 are deeper than the p-type semiconductor regions PR1 from the sides of the grooves DT1 to DT3. Ion implantation energy for forming the p-type semiconductor regions PR1 is equal to ion implantation energy for forming the p-type semiconductor regions PR3. However, the implantation angle of ion implantation for forming the p-type semiconductor regions PR3 is closer to the vertical direction with respect to the sides of the grooves DT1 to DT3 as compared with the implantation angle of ion implantation for forming the p-type semiconductor regions PR1, so that the p-type semiconductor regions PR3 are deeper than the p-type semiconductor regions PR1 with respect to the sides of the grooves DT1 to DT3.

The p-type semiconductor region PR3 is formed only inside the broken line shown in FIG. 13. In other words, like the p-type semiconductor region PR1, the p-type semiconductor region PR3 is formed with the lower end in contact with the broken line. The broken line connects the lower end of the p-type semiconductor region PR1 or PR3, that is, a position separated from the groove D1 to be filled with a p-type column region PC1, and the lower end of the groove D1. The lower end of the p-type semiconductor region and the lower end of the groove are located on a straight line. The p-type semiconductor regions PR1 and PR3 formed thus constitute the p-type column region and substantially incline one side of the p-type column region.

In this configuration, after the p-type semiconductor regions PR3 are formed, the step of removing the photoresist film PR, the cleaning step, and the epitaxial growth step in FIG. 7 are performed as will be discussed below without thermal treatment for activating the p-type semiconductor regions PR3.

After that, the semiconductor device of the present embodiment in FIG. 24 can be formed by the same steps as in the steps of FIGS. 7 to 12. As shown FIG. 24, the adjacent p-type semiconductor regions PR1 and PR3 are formed on each side of the n-type pillar. The p-type semiconductor region PR1 is formed under the p-type semiconductor region PR3.

The p-type semiconductor regions PR1 and PR3 may partially overlap each other. In this case, both of the p-type semiconductor regions PR1 and PR3 are formed on the top surface of the epitaxial layer EPS. The p-type semiconductor region PR1 is partially adjacent to the p-type column region PC1 in a region under the p-type semiconductor region PR3. Moreover, the p-type semiconductor region PR3 formed from the p-type column region PC1 is partially longer than the p-type semiconductor region PR1 in the X direction.

The p-type semiconductor regions PR1 and PR3 are formed in the n-type pillars where the n-type column region NC1 and n-type column regions NC2 and NC3 are formed. The semiconductor regions have p-type conductivity. In other words, the p-type semiconductor regions PR1 and PR3 do not constitute the n-type column regions NC1 to NC3. The p-type semiconductor region PR3 has a p-type impurity concentration of, for example, about $8 \times 10^{15}/cm^3$. In other words, the p-type semiconductor region PR3 has the same impurity concentration as the p-type column regions PC1 to PC3.

In a cell region CR, an n-type column region NC1 is formed between the p-type semiconductor regions PR3 formed on the respective sides of the n-type pillar. Also in an intermediate region TR, the n-type column region NC2 is formed between the p-type semiconductor regions PR3 formed on the respective sides of the n-type pillar. Also in a peripheral region PER, the n-type column region NC3 is formed between the p-type semiconductor regions PR3 formed on the respective sides of the n-type pillar. In other words, the n-type column region NC1, the p-type semiconductor region PR3, the p-type column region PC1, the p-type semiconductor region PR3, and the n-type column region NC1 are sequentially disposed in the X direction, for example, in the cell region CR.

The width of the p-type semiconductor region PR3 in the X direction is substantially uniform from the upper end to the lower end of the p-type semiconductor region PR3. In other words, the p-type semiconductor regions PR3 extend along the sides of the p-type column region PC1, PC2, or PC3. Moreover, the p-type semiconductor regions PR3 extend in the Y direction along the p-type column region PC1 or PC2 shown in FIG. 3. Furthermore, the p-type semiconductor regions PR3 extend in the Y direction along the p-type column regions PC3 extending in the Y direction in FIG. 3. In FIG. 3, the p-type semiconductor regions PR3 are not shown.

Unlike in the first embodiment, the p-type semiconductor regions constituting the p-type column region may be formed at different depths as described in the present embodiment. Thus, the overall p-type column region including the p-type semiconductor regions PR1 and PR3 and the p-type column region PC1 in FIG. 24 can be brought close to a shape with sides inclined toward the top surface of the semiconductor substrate 1S from the sides of the p-type column region PC1. This can increase the tolerance (charge balance margin) of variations in the p-type impurity concentration of the p-type column regions PC1 as compared with the first embodiment. Thus, even if an increase in the aspect ratio of the p-type column region is likely to vary the impurity concentrations of the p-type column regions, the withstand voltage of the semiconductor device is secured with ease. In other words, the epitaxial layer EPS is easily increased in thickness and the n-type column NC1 and the p-type column region PC1 are easily reduced in width, thereby improving the performance of the semiconductor device.

The invention made by the present inventors was specifically described according to the foregoing embodiments. Obviously, the present invention is not limited to the embodiments and can be changed in various ways without departing from the scope of the invention.

For example, the second embodiment and the third embodiment may be combined.

Alternatively, the p-type semiconductor regions PR2 (FIG. 15) described as the modification of the first embodiment may be formed in the semiconductor device of the third embodiment. In this case, the p-type semiconductor region PR2 has a larger width than the p-type semiconductor region PR3 (FIG. 24) in the X direction and has a smaller depth than the p-type semiconductor region PR3.

In the foregoing embodiments, the substrate made of silicon (Si) and the semiconductor device including the epitaxial layer were described. The semiconductor device may be made of silicon carbide (SiC) instead of Si. In other words, the semiconductor substrate, the p-type column regions, and the n-type column regions may be made of SiC.

What is claimed is:

1. A method of manufacturing a semiconductor device, comprising the steps of:
   (a) forming a plurality of first grooves over a semiconductor layer of a first conductivity type;
   (b) forming a first semiconductor region of a second conductivity type on a side of each first groove by implanting an impurity of the second conductivity type opposite to the first conductivity type to the side the first groove diagonally at a first angle with respect to a top surface of the semiconductor layer;
   (c) forming a first pillar in each first groove by filling the first groove with a semiconductor of the second conductivity type, and forming a second pillar including the semiconductor layer between the first pillars; and
   (d) forming a semiconductor element over the semiconductor layer,
   wherein the first semiconductor region is formed from an upper end of a side of the second pillar to a certain depth of the second pillar,
   wherein the method further comprises the step of:
   (b1) after the step (a), forming a second semiconductor region of the second conductivity type over the top surface of the semiconductor layer by implanting the impurity of the second conductivity type to the side of the first groove diagonally at a second angle with respect to the top surface of the semiconductor layer before the step (c),
   wherein the second semiconductor region has a smaller depth than the first semiconductor region, and
   wherein the second semiconductor region has a higher impurity concentration than the first semiconductor region.

2. A method at manufacturing a semiconductor device, comprising the steps of:
   (a) forming a plurality of first grooves over a semiconductor layer of a first conductivity type;
   (b) forming a first semiconductor region of a second conductivity type on a side of each first groove by implanting an impurity of the second conductivity type opposite to the first conductivity type to the side of the first groove diagonally at a first angle with respect to a top surface of the semiconductor layer;
   (c) forming a first pillar in each first groove by filling the first groove with a semiconductor of the second conductivity type, and forming a second pillar including the semiconductor layer between the first pillars; and
   (d) forming a semiconductor element over the semiconductor layer,
   wherein the first semiconductor region is formed from an upper end of a side of the second pillar to a certain depth of the second pillar,
   wherein the method further comprises the step of:
   (b2) after the step (a), forming a second semiconductor region of the second conductivity type over the side of the first groove by implanting the impurity of the second conductivity type to the side of the first groove diagonally at a second angle with respect to the top surface of the semiconductor layer before the step (c),
   wherein the first angle is closer to a right angle with respect to the top surface of the semiconductor layer than the second angle,
   wherein the second semiconductor region has a smaller depth than the first semiconductor region, and
   wherein the second semiconductor region has a larger width than the first semiconductor region in a first direction along which the first and second pillars are arranged.

3. The method of manufacturing a semiconductor device according to claim 1,
   wherein in the step (c), the semiconductor layer is heated to at least 1000° C.

4. The method of manufacturing a semiconductor device according to claim 1,
   wherein the first pillars and the second pillar are made of silicon carbide.

5. The method of manufacturing a semiconductor device according to claim 1,
   wherein the semiconductor element is a field-effect transistor including a gate electrode embedded in a second groove formed over a top surface of the semiconductor layer.

6. The method of manufacturing a semiconductor device according to claim 2,
   wherein in the step (c), the semiconductor layer is heated to at least 1000° C.

7. The method of manufacturing a semiconductor device according to claim 2,
   wherein the first pillars and the second pillar are made of silicon carbide.

8. The method of manufacturing a semiconductor device according to claim 2,
   wherein the semiconductor element is a field-effect transistor including a gate electrode embedded in a second groove formed over a top surface of the semiconductor layer.

* * * * *